(12) United States Patent
Lee et al.

(10) Patent No.: US 11,683,958 B2
(45) Date of Patent: Jun. 20, 2023

(54) DISPLAY DEVICE

(71) Applicant: Samsung Display Co., LTD., Yongin-si (KR)

(72) Inventors: Seung Chan Lee, Hwaseong-si (KR); Beom Soo Park, Seongnam-si (KR); Wang Jo Lee, Suwon-si (KR); Jae Bum Cho, Seoul (KR); Jae Ik Lim, Hwaseong-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 184 days.

(21) Appl. No.: 17/340,236

(22) Filed: Jun. 7, 2021

(65) Prior Publication Data
US 2022/0077263 A1 Mar. 10, 2022

(30) Foreign Application Priority Data
Sep. 9, 2020 (KR) .................. 10-2020-0115380

(51) Int. Cl.
*H01L 27/14* (2006.01)
*H10K 59/121* (2023.01)
(Continued)

(52) U.S. Cl.
CPC ..... *H10K 59/1213* (2023.02); *H10K 59/1216* (2023.02); *H10K 59/131* (2023.02);
(Continued)

(58) Field of Classification Search
CPC ............ H01L 27/3262; H01L 27/3265; H01L 27/3276; H01L 27/1225; H01L 27/124; H01L 27/1251; H01L 27/1255; H01L 29/78675; H01L 29/7869; H01L 27/3244; H01L 27/1248; G09G 3/3233
(Continued)

(56) References Cited

U.S. PATENT DOCUMENTS 9,431,430 B2 * 8/2016 Yamazaki ........... H01L 27/1222
2021/0359066 A1 11/2021 An et al.

FOREIGN PATENT DOCUMENTS

KR 1020050123332 A 12/2005
KR 1020080093340 A 10/2008
(Continued)

*Primary Examiner* — Tan N Tran
(74) *Attorney, Agent, or Firm* — Cantor Colburn LLP

(57) ABSTRACT

A display device includes: a substrate; a polycrystalline semiconductor layer which includes a first electrode, a channel, and a second electrode of a driving transistor disposed on the substrate; a first gate insulating layer disposed on the polycrystalline semiconductor layer; a gate electrode of the driving transistor which is disposed on the first gate insulating layer and overlaps the channel; a lower first scan line disposed on the first gate insulating layer; a second gate insulating layer disposed on the gate electrode and on the lower first scan line; a first lower boost electrode disposed on the second gate insulating layer; a first interlayer-insulating layer disposed on the first lower boost electrode; an oxide semiconductor layer disposed on the first interlayer-insulating layer and including a first upper boost electrode overlapping the first lower boost electrode; and a first connection electrode connecting the gate electrode and the first upper boost electrode.

18 Claims, 23 Drawing Sheets

(51) Int. Cl.
*H10K 59/131* (2023.01)
*H01L 27/12* (2006.01)
*H01L 29/786* (2006.01)

(52) U.S. Cl.
CPC ........ *H01L 27/124* (2013.01); *H01L 27/1225* (2013.01); *H01L 27/1251* (2013.01); *H01L 27/1255* (2013.01); *H01L 29/7869* (2013.01); *H01L 29/78675* (2013.01)

(58) Field of Classification Search
USPC .................................................. 257/59, 72
See application file for complete search history.

(56) References Cited

FOREIGN PATENT DOCUMENTS

| KR | 1020140127048 A | 11/2014 |
|---|---|---|
| KR | 1020200052782 A | 5/2020 |
| KR | 1020210142055 A | 11/2021 |

* cited by examiner

DISPLAY DEVICE

This application claims priority to Korean Patent Application No. 10-2020-0115380, filed on Sep. 9, 2020, and all the benefits accruing therefrom under 35 U.S.C. § 119, the content of which in its entirety is herein incorporated by reference.

BACKGROUND

1. Field

The present disclosure relates to a display device.

2. Description of the Related Art

An organic light emitting display device includes two electrodes and an organic light emitting layer interposed therebetween. Here, electrons injected from one electrode and holes injected from another electrode are combined in the organic light emitting layer to generate excitons. The generated excitons are changed to a ground state from an excited state, releasing energy to emit light.

Such an organic light emitting display device includes a plurality of pixels each including an organic light emitting diode which is a self-emissive element, and in each pixel, a plurality of transistors for driving the organic light emitting diode and at least one capacitor are formed. The plurality of transistors may basically include a switching transistor and a driving transistor.

The capacitor has a structure in which an insulator is disposed between two conductors, and a capacitance thereof may increase as an area of the conductor is wider and a distance between the two conductors is closer.

SUMMARY

When the area of the conductor is increased to secure high capacitance, an area occupied by the capacitor in one pixel increases, and thus it is difficult to implement high resolution.

Embodiments are to provide a display device that may reduce an area occupied by a capacitor to implement high resolution while maintaining a capacitance of the capacitor.

An embodiment provides a display device including: a substrate; a polycrystalline semiconductor layer which includes a first electrode, a channel, and a second electrode of a driving transistor disposed on the substrate; a first gate insulating layer disposed on the polycrystalline semiconductor layer; a gate electrode of the driving transistor which is disposed on the first gate insulating layer and overlaps the channel of the driving transistor in a plan view; a lower first scan line disposed on the first gate insulating layer; a second gate insulating layer disposed on the gate electrode of the driving transistor and on the lower first scan line; a first lower boost electrode disposed on the second gate insulating layer; a first interlayer-insulating layer disposed on the first lower boost electrode; an oxide semiconductor layer disposed on the first interlayer-insulating layer and including a first upper boost electrode overlapping the first lower boost electrode in the plan view; and a first connection electrode connecting the gate electrode of the driving transistor and the first upper boost electrode.

The display device may further include a storage electrode of a storage capacitor disposed on the second gate insulating layer and overlapping the gate electrode of the driving transistor in the plan view. The storage electrode may be disposed in the same layer as the first lower boost electrode.

The display device may further include a third gate insulating layer disposed on the oxide semiconductor layer, and a gate electrode of a third transistor disposed on the third gate insulating layer. The oxide semiconductor layer may further include a first electrode, a channel, and a second electrode of a third transistor which are disposed on the first interlayer-insulating layer; the gate electrode of the third transistor may overlap the channel of the third transistor in the plan view; the first electrode of the third transistor may be connected to a second electrode of the driving transistor; and the second electrode of the third transistor may be connected to the first upper boost electrode.

The display device may further include a second connection electrode connecting the first electrode of the third transistor and the second electrode of the driving transistor. The second electrode of the third transistor may be monolithic with the first upper boost electrode.

The display device may further include an upper first scan line disposed on the second gate insulating layer. The first lower boost electrode may extend from and may be monolithic with the upper first scan line, and a first scan signal may be commonly applied to the lower first scan line and the upper first scan line.

The upper first scan line may overlap the lower first scan line in the plan view, and the upper first scan line may be connected to the lower first scan line.

The display device may further include a third connection electrode connecting the upper first scan line and the lower first scan line.

The display device may further include: a first electrode, a channel, and a second electrode of a third transistor which are disposed on the first interlayer-insulating layer; a third gate insulating layer disposed on the first electrode, the channel, and the second electrode of the third transistor; and a gate electrode of the third transistor which is disposed on the third gate insulating layer and overlaps the channel of the third transistor in the plan view. The third connection electrode may be disposed in the same layer as the gate electrode of the third transistor.

The third gate insulating layer may define a first opening overlapping the lower first scan line and a second opening overlapping the upper first scan line; the third connection electrode may be connected to the lower first scan line through the first opening; and the third connection electrode may be connected to the upper first scan line through the second opening.

The third gate insulating layer may define an opening overlapping the lower first scan line and the upper first scan line; the third connection electrode may be connected to an upper surface of the lower first scan line through the opening; and the third connection electrode may be connected to a lateral surface of the upper first scan line through the opening.

The display device may further include a third gate insulating layer and a second interlayer-insulating layer which are disposed on the first interlayer-insulating layer. The first connection electrode and the third connection electrode may be disposed on the second interlayer-insulating layer.

The upper first scan line may be directly connected to the lower first scan line.

The lower first scan line may not overlap the first lower boost electrode and the first upper boost electrode.

The display device may include a plurality of pixels including a first pixel and a second pixel; the first pixel may include the substrate, the first electrode, the channel, and the second electrode of the driving transistor, the first gate insulating layer, the gate electrode of the driving transistor, the lower first scan line, the second gate insulating layer, the first lower boost electrode, the first interlayer-insulating layer, and the first upper boost electrode; and the second pixel may include the substrate, a first electrode, a channel, a the second electrode of another driving transistor, the first gate insulating layer, a gate electrode of the another driving transistor, the lower first scan line, the second gate insulating layer, the first interlayer-insulating layer, a second lower boost electrode which is disposed between the first gate insulating layer and the second gate insulating layer and is connected to the lower first scan line, and a second upper boost electrode which is disposed on the first interlayer-insulating layer, overlaps the second lower boost electrode, and includes an oxide semiconductor.

The first pixel and the second pixel may display different colors.

The second lower boost electrode may extend from and may be monolithic with the lower first scan line.

The first lower boost electrode and the first upper boost electrode may form a first boost capacitor, the second lower boost electrode and the second upper boost electrode may form a second boost capacitor, and a capacitance of the first boost capacitor may be different from a capacitance of the second boost capacitor.

The capacitance of the first boost capacitor may be larger than the capacitance of the second boost capacitor.

The display device may further include an upper first scan line which is disposed on the second gate insulating layer and is connected to the lower first scan line, wherein the lower first scan line may be disposed in both the first pixel and the second pixel, and the upper first scan line may be disposed in the second pixel and is not disposed in the first pixel.

The display device may further include an upper first scan line which is disposed on the second gate insulating layer and is connected to the lower first scan line, wherein the upper first scan line may not overlap the second lower boost electrode and the second upper boost electrode in the plan view, and the lower first scan line may not overlap the first lower boost electrode and the first upper boost electrode in the plan view.

According to the embodiments, by reducing a distance between conductors forming a capacitor, it is possible to reduce an area occupied by the capacitor and realize high resolution while maintaining a capacitance of the capacitor.

DETAILED DESCRIPTION

Figure 1:
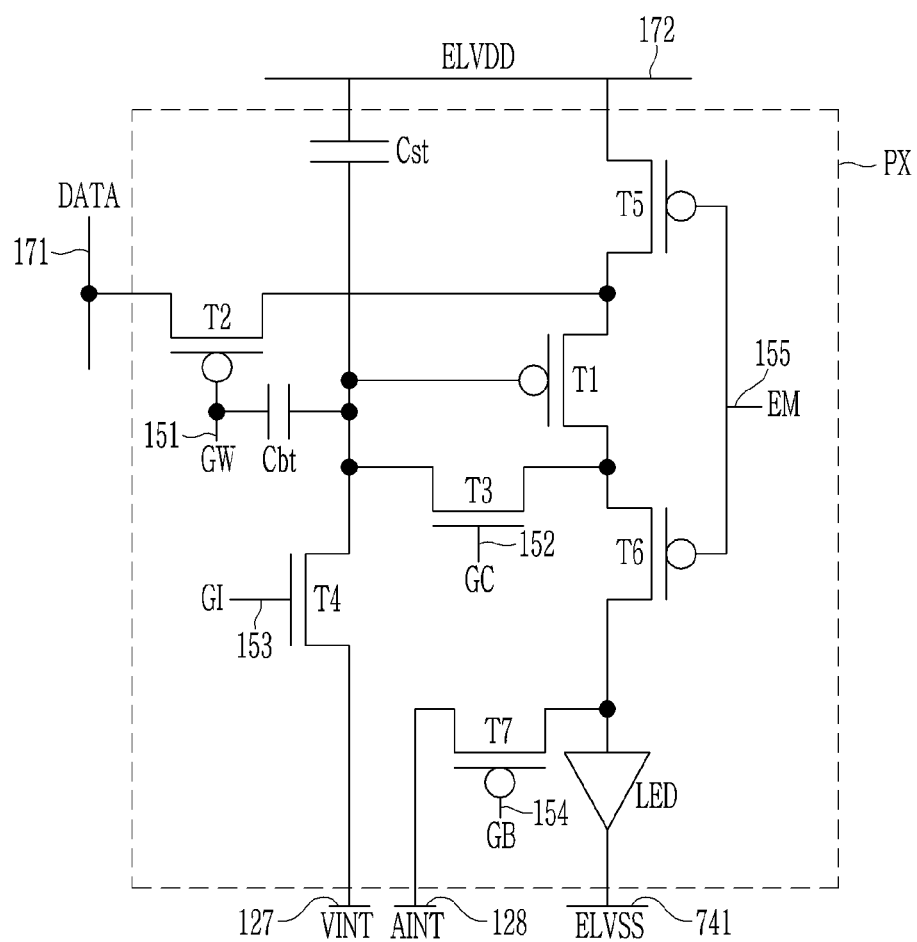
FIG. 1 illustrates a circuit diagram of a pixel of a display device according to an embodiment.

The present invention will be described more fully hereinafter with reference to the accompanying drawings, in which embodiments of the invention are shown. As those skilled in the art would realize, the described embodiment may be modified in various different ways, all without departing from the spirit or scope of the present invention.

In order to clearly describe the present invention, parts that are irrelevant to the description are omitted, and identical or similar constituent elements throughout the specification are denoted by the same reference numerals.

Further, in the drawings, the size and thickness of each element are arbitrarily illustrated for ease of description, and the present disclosure is not necessarily limited to those illustrated in the drawings. In the drawings, the thicknesses of layers, films, panels, regions, areas etc., are exaggerated for clarity. In the drawings, for ease of description, the thicknesses of some layers and areas are exaggerated.

It will be understood that when an element such as a layer, film, region, area or substrate is referred to as being "on" another element, it can be directly on the other element or intervening elements may also be present. In contrast, when an element is referred to as being "directly on" another element, there are no intervening elements present. Further, in the specification, the word "on" or "above" means positioned on or below the object portion, and does not necessarily mean positioned on the upper side of the object portion based on a gravitational direction.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "At least one" is not to be construed as limiting "a" or "an." "Or" means "and/or." As used herein, the term "and/or" includes any and all combinations of one or more of the associated listed items.

In addition, unless explicitly described to a first contrary, the word "comprise" and variations such as "comprises" or "comprising" will be understood to imply the inclusion of stated elements but not the exclusion of any other elements.

Further, throughout the specification, the phrase "in a plan view" or "on a plane" means viewing a target portion from the top, and the phrase "in a cross-sectional view" or "on a cross-section" means viewing a cross-section formed by vertically cutting a target portion from the side.

First, a pixel of a display device according to an embodiment will be described with reference to FIG. 1.

FIG. 1 illustrates a circuit diagram of a pixel of a display device according to an embodiment.

As shown in FIG. 1, one pixel PX of the display device according to the embodiment includes transistors T1, T2, T3, T4, T5, T6, and T7, a storage capacitor Cst, a boost capacitor Cbt, and a light emitting diode LED, connected to a plurality of wires 127, 128, 151, 152, 153, 154, 155, 171, 172, and 741.

The plurality of wires 127, 128, 151, 152, 153, 154, 155, 171, 172, and 741 are connected to one pixel PX. The plurality of wires includes a first initialization voltage line 127, a second initialization voltage line 128, a first scan line 151, a second scan line 152, an initialization control line 153, a bypass control line 154, a light emission control line 155, a data line 171, a driving voltage line 172, and a common voltage line 741.

The first scan line 151 is connected to a gate driver (not shown) to transmit a first scan signal GW to the second transistor T2. The second scan line 152 may be applied with a voltage of an opposite polarity to a voltage applied to the first scan line 151 at the same time as the first scan signal GW applied to the first scan line 151. For example, when a negative voltage is applied to the first scan line 151, a positive voltage may be applied to the second scan line 152. The second scan line 152 transmits a second scan signal GC to the third transistor T3.

The initialization control line 153 transmits an initialization control signal GI to the fourth transistor T4. The bypass control line 154 transmits a bypass signal GB to the seventh transistor T7. The bypass control line 154 may be a first scan line 151 of a previous pixel PX. The light emission control line 155 transmits a light emission control signal EM to the fifth transistor T5 and the sixth transistor T6.

The data line 171 is a wire that transmits a data voltage DATA generated by a data driver (not shown), and luminance emitted by the light emitting diode LED is changed according to the data voltage DATA applied to the pixel PX.

The driving voltage line 172 applies a driving voltage ELVDD to the fifth transistor T5 and the storage capacitor Cst. The first initialization voltage line 127 transmits a first initialization voltage VINT, and the second initialization voltage line 128 transmits a second initialization voltage AINT. The common voltage line 741 applies a common voltage ELVSS to a cathode electrode of the light emitting diode LED. In the present embodiment, each of voltages applied to the driving voltage line 172, the first and second initialization voltage lines 127 and 128, and the common voltage line 741 may be a constant voltage.

Hereinafter, a structure and a connection relationship of the plurality of transistors will be described in detail.

The driving transistor T1 may have characteristics of a p-type transistor, and may include a polycrystalline semiconductor. The driving transistor T1 is a transistor that adjusts an amount of current outputted to an anode electrode of the light emitting diode LED according to the data voltage DATA applied to a gate electrode of the driving transistor T1. Brightness of the light emitting diode LED is adjusted according to the amount of the driving current outputted to the anode electrode of the light emitting diode LED, so it is possible to adjust the luminance of the light emitting diode LED. For this purpose, a first electrode of the driving transistor T1 is disposed to receive the driving voltage ELVDD, and is connected to the driving voltage line 172 via the fifth transistor T5. In addition, the first electrode of the driving transistor T1 is connected to a second electrode of the second transistor T2 to receive the data voltage DATA. A second electrode of the driving transistor T1 is disposed to output a current toward the light emitting diode LED, and is connected to the anode electrode of the light emitting diode LED via the sixth transistor T6. In addition, the second electrode of the driving transistor T1 transmits the data voltage DATA applied to the first electrode thereof to the third transistor T3. A gate electrode of the driving transistor T1 is connected to one electrode of the storage capacitor Cst (hereinafter referred to as a "second storage electrode"). Accordingly, a voltage of the gate electrode of the driving transistor T1 is changed according to a voltage stored in the storage capacitor Cst, and accordingly, a driving current outputted from the driving transistor T1 is changed. In addition, the storage capacitor Cst serves to maintain the voltage of the gate electrode of the driving transistor T1 to be constant for one frame.

The second transistor T2 may have characteristics of a p-type transistor, and may include a polycrystalline semiconductor. The second transistor T2 is a transistor that allows the data voltage DATA to be received into the pixel PX. A gate electrode of the second transistor T2 is connected to the first scan line 151 and one electrode of the boost capacitor Cbt (hereinafter referred to as a "lower boost electrode"). A first electrode of the second transistor T2 is connected to the data line 171. A second electrode of the second transistor T2 is connected to the first electrode of the driving transistor T1. When the second transistor T2 is turned on by a negative voltage of the first scan signal GW transmitted through the first scan line 151, the data voltage DATA received through the data line 171 is transmitted to the first electrode of the driving transistor T1.

The third transistor T3 may have characteristics of an n-type transistor, and may include an oxide semiconductor. The third transistor T3 electrically connects the second electrode of the driving transistor T1 and the gate electrode of the driving transistor T1. As a result, the third transistor T3 is a transistor that allows a compensation voltage, that is changed as the data voltage DATA passes through the driving transistor T1, to be transmitted to the second storage electrode of the storage capacitor Cst. A gate electrode of the third transistor T3 is connected to the second scan line 152, and a first electrode of the third transistor T3 is connected to the second electrode of the driving transistor T1. A second electrode of the third transistor T3 is connected to the second storage electrode of the storage capacitor Cst, the gate electrode of the driving transistor T1, and the other electrode of the boost capacitor Cbt (hereinafter referred to as an "upper boost electrode"). The third transistor T3 is turned on by a positive voltage of the second scan signal GC transmitted through the second scan line 152 to connect the gate electrode of the driving transistor T1 and the second electrode of the driving transistor T1, and to allow a voltage applied to the second electrode of the driving transistor T1 to be transmitted to the second storage electrode of the storage capacitor Cst to be stored in the storage capacitor Cst.

The fourth transistor T4 may have characteristics of an n-type transistor, and may include an oxide semiconductor. The fourth transistor T4 initializes the gate electrode of the driving transistor T1 and the second storage electrode of the storage capacitor Cst. A gate electrode of the fourth transistor T4 is connected to the initialization control line 153, and a first electrode of the fourth transistor T4 is connected to the first initialization voltage line 127. A second electrode of the fourth transistor T4 is connected to the second storage electrode of the storage capacitor Cst, the gate electrode of the driving transistor T1, and the upper boost electrode via the second electrode of the third transistor T3. The fourth transistor T4 is turned on by a positive voltage of the initialization control signal GI received through the initialization control line 153, and at this time, the first initialization voltage VINT is transmitted to the gate electrode of the driving transistor T1 and the second storage electrode of the storage capacitor Cst via the fourth transistor T4. Accordingly, a voltage of the gate electrode of the driving transistor T1 and the storage capacitor Cst is initialized.

The fifth transistor T5 may have characteristics of a p-type transistor, and may include a polycrystalline semiconductor. The fifth transistor T5 serves to transmit the driving voltage ELVDD to the driving transistor T1. A gate electrode of the fifth transistor T5 is connected to the light emission control line 155, a first electrode of the fifth transistor T5 is connected to the driving voltage line 172, and a second electrode of the fifth transistor T5 is connected to the first electrode of the driving transistor T1.

The sixth transistor T6 may have characteristics of a p-type transistor, and may include a polycrystalline semiconductor. The sixth transistor T6 serves to transmit a driving current outputted from the driving transistor T1 to the light emitting diode LED. A gate electrode of the sixth transistor T6 is connected to the light emission control line 155, a first electrode of the sixth transistor T6 is connected to the second electrode of the driving transistor T1, and a second electrode of the sixth transistor T6 is connected to the anode of the light emitting diode LED.

The seventh transistor T7 may have characteristics of a p-type transistor, and may include a polycrystalline semiconductor. The seventh transistor T7 serves to initialize the anode of the light emitting diode LED. A gate electrode of the seventh transistor T7 is connected to the bypass control line 154, a first electrode of the seventh transistor T7 is connected to the anode of the light emitting diode LED, and a second electrode of the seventh transistor T7 is connected to the second initialization voltage line 128. When the seventh transistor T7 is turned on by a negative voltage of the bypass signal GB, the second initialization voltage AINT is applied to the anode of the light emitting diode LED to initialize the light emitting diode LED.

In the above, it has been described that one pixel includes seven transistors T1 to T7, one storage capacitor Cst, and one boost capacitor Cbt, but the present invention is not limited thereto, and the number of transistors, the number of capacitors, and their connection relationship may be variously changed.

In the present embodiment, the driving transistor T1 may include a polycrystalline semiconductor. In addition, each of the third transistor T3 and the fourth transistor T4 may include an oxide semiconductor. Each of the second transistor T2, the fifth transistor T5, the sixth transistor T6, and the seventh transistor T7 may include a polycrystalline semiconductor. However, the present invention is not limited thereto, and at least one of the second transistor T2, the fifth transistor T5, the sixth transistor T6, and the seventh transistor T7 may include an oxide semiconductor in another embodiment. In the present embodiment, by making the third transistor T3 and the fourth transistor T4 to contain a semiconductor material (e.g., oxide semiconductor) that is different from the semiconductor material (e.g., polycrystalline semiconductor) of the driving transistor T1, they may be more stably driven, and their reliability may be improved.

As described above, when a positive voltage is applied to the first scan line 151, a negative voltage is applied to the second scan line 152, and when a negative voltage is applied to the first scan line 151, a positive voltage is applied to the second scan line 152. That is, since the second scan signal GC applied to the second scan line 152 has an opposite polarity of the first scan signal GW applied to the first scan line 151, it lowers the gate voltage of the driving transistor T1 after data is written thereto. In contrast, the first scan signal GW increases the gate voltage of the driving transistor T1. Therefore, when a black voltage (i.e., a voltage for driving the lowest luminance from the light emitting diode LED) is written, the black voltage may be decreased. However, in an embodiment according to the invention, by positioning the boost capacitor Cbt between the first scan line 151 and the gate electrode of the driving transistor T1, when the second transistor T2 is turned on, by adjusting the gate voltage of the driving transistor T1, it is possible to allow the driving transistor T1 to be smoothly turned on such that the data voltage DATA may be well transmitted to the third transistor T3. Therefore, the black voltage may be stably outputted.

An amount of change in the gate voltage of the driving transistor T1 due to the boost capacitor Cbt may be defined as a boosting voltage. The boosting voltage may be determined by Equation 1.

$$Vb = \frac{Cboost}{Cstorage + Cboost} \times (VGH - VGL) \qquad \text{(Equation 1)}$$

Here, Vb is the boosting voltage, Cboost is a boost capacitor capacitance of the boost capacitor Cbt, Cstorage is a storage capacitor capacitance of the storage capacitor Cst, VGH is gate high voltage, VGL is gate low voltage)

Therefore, as the capacitance of the boost capacitor Cbt increases, the gate voltage of the driving transistor T1 may be more changed. By adjusting the capacitance of the boost capacitor Cbt, the gate voltage of the driving transistor T1 may be controlled.

Hereinafter, planar and cross-sectional structures of the driving transistor T1, the third transistor T3, the first scan line 151, and the boost capacitor Cbt will be further described with reference to FIG. 2 to FIG. 10.

Figure 2:
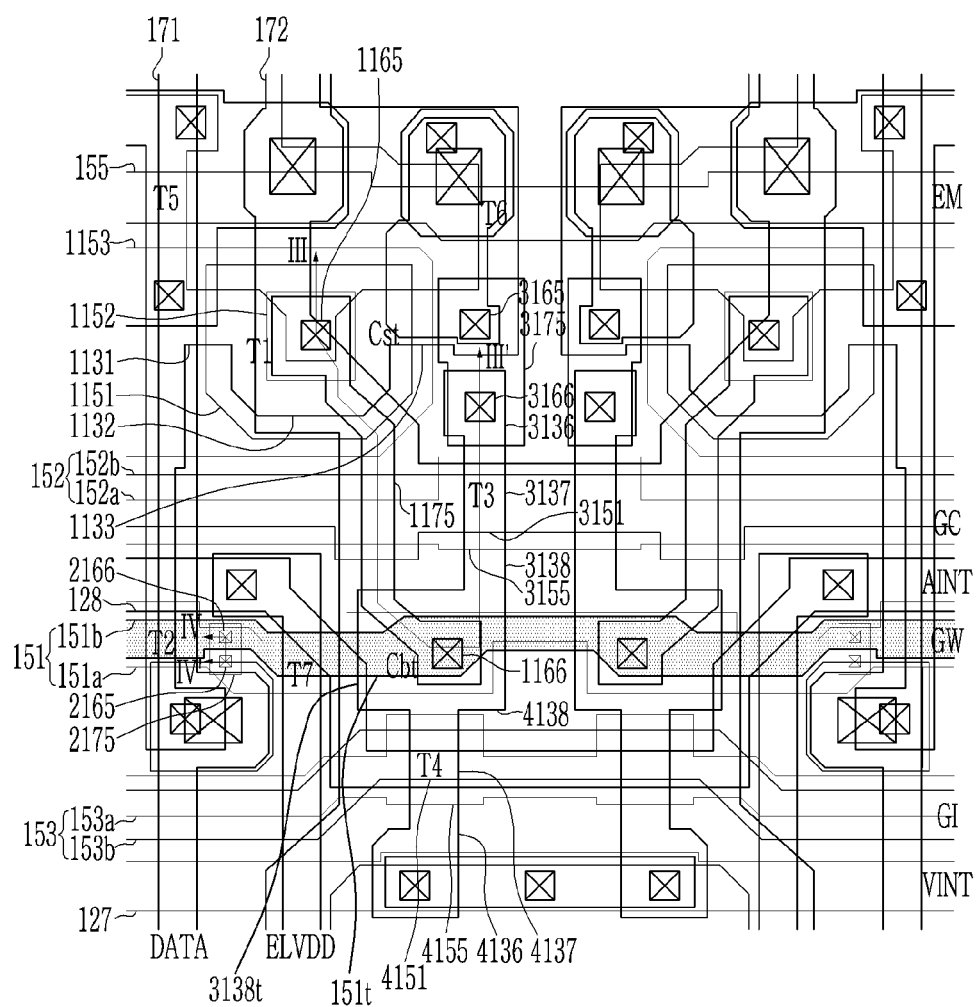
FIG. 2 illustrates a top plan view of pixels of a display device according to an embodiment.
Figure 3:
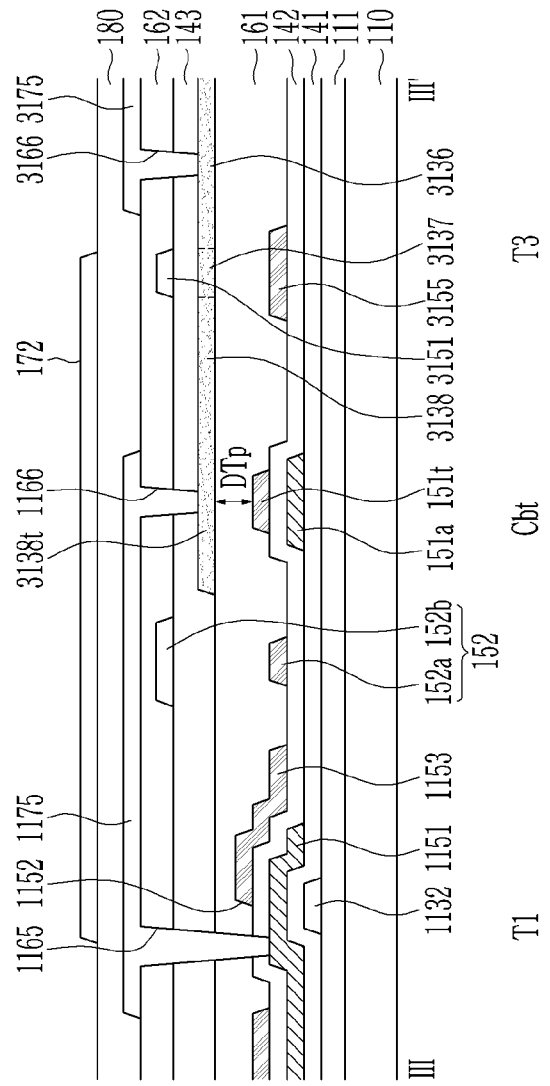
FIG. 3 illustrates a cross-sectional view taken along line of FIG. 2.
Figure 4:
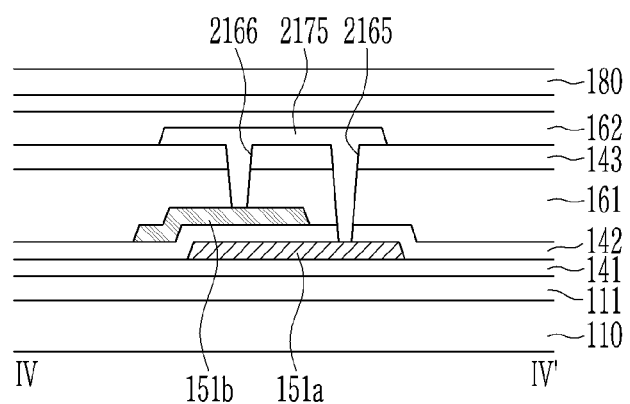
FIG. 4 illustrates a cross-sectional view taken along line IV-IV of FIG. 2.

FIG. 2 illustrates a top plan view of pixels of a display device according to an embodiment, FIG. 3 illustrates a cross-sectional view taken along line of FIG. 2, and FIG. 4 illustrates a cross-sectional view taken along line IV-IV of FIG. 2. FIG. 5 to FIG. 10 illustrate layout views of a pixel in an order of a manufacturing process of a display device according to an embodiment. FIG. 2 to FIG. 10 illustrate two adjacent pixels, and the two pixels may be symmetrical to each other. However, the structural relationships between two pixels according to the invention are not limited thereto, and the two pixels may have asymmetric shapes in another embodiment. In this case, the two adjacent pixels may have substantially the same shape. That is, pixels having the same shape may be repeatedly disposed. Hereinafter, a pixel disposed at a left side will be mainly described. In addition, since the seventh transistor T7 is connected to the previous first scan line 151, its illustration is omitted, and instead, the next seventh transistor T7 is illustrated.

Figure 5:
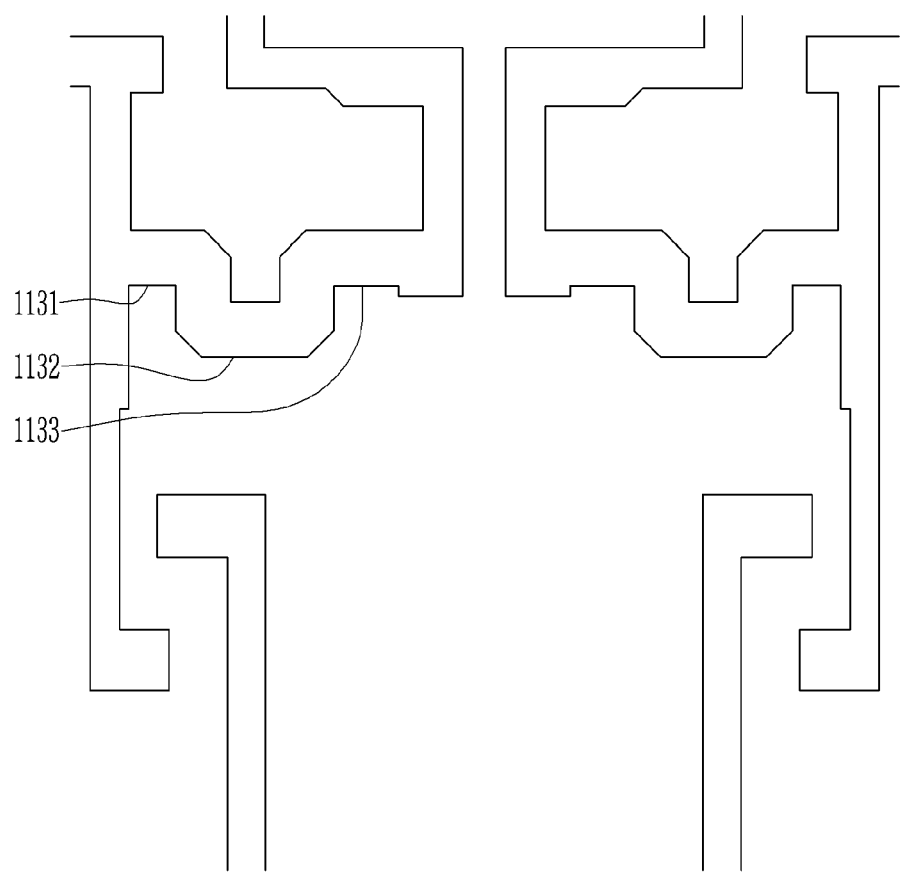
FIG. 5 to FIG. 10 illustrate layout plan views of the pixels in an order of a manufacturing process of a display device according to an embodiment.

As shown in FIG. 2 to FIG. 10, a polycrystalline semiconductor layer including a channel 1132, a first electrode 1131, and a second electrode 1133 of the driving transistor T1 may be disposed on a substrate 110. FIG. 5 illustrates the polycrystalline semiconductor layer. The polycrystalline semiconductor layer may further include a channel, a first electrode, and a second electrode of each of the second transistor T2, the fifth transistor T5, the sixth transistor T6, and the seventh transistor T7, as well as the driving transistor T1.

The channel 1132 of the driving transistor T1 may have a curved shape in a plan view. However, the shape of the channel 1132 of the driving transistor T1 is not limited thereto, and may be variously changed. For example, the channel 1132 of the driving transistor T1 may be bent in a different shape, or may have a rod shape. The first electrode 1131 and the second electrode 1133 of the driving transistor T1 may be disposed on opposite sides of the channel 1132 of the driving transistor T1, respectively. The first electrode 1131 of the driving transistor T1 extends up and down in a plan view, and a portion of the first electrode 1131 extending in the downward direction (in FIGS. 2, 5 and 10) may be connected to the second electrode of the second transistor T2, and a portion of the first electrode 1131 extending in the upward direction (in FIGS. 2, 5 and 10) may be connected to the second electrode of the fifth transistor T5. The second electrode 1133 of the driving transistor T1 may extend upward in a plan view (See FIGS. 2, 5 and 10) to be connected to the first electrode of the sixth transistor T6.

A buffer layer 111 may be disposed between the substrate 110 and the polycrystalline semiconductor layer including the channel 1132, the first electrode 1131, and the second electrode 1133 of the driving transistor T1. The buffer layer 111 may have a single layered or multi-layered structure. The buffer layer 111 may include an inorganic insulating material such as a silicon nitride (SiNx), a silicon oxide (SiOx), and a silicon oxynitride (SiOxNy), or an organic insulating material. In addition, a barrier layer (not shown) may be further disposed between the substrate 110 and the buffer layer 111. The barrier layer may have a single layered or multi-layered structure. The barrier layer may include an inorganic insulating material such as a silicon nitride (SiNx), a silicon oxide (SiOx), and a silicon oxynitride (SiOxNy).

A first gate insulating layer 141 may be disposed on the polycrystalline semiconductor layer including the channel 1132, the first electrode 1131, and the second electrode 1133 of the driving transistor T1. The first gate insulating layer 141 may have a single layered or multi-layered structure. The first gate insulating layer 141 may include an inorganic insulating material such as a silicon nitride (SiNx), a silicon oxide (SiOx), and a silicon oxynitride (SiOxNy).

Figure 6:
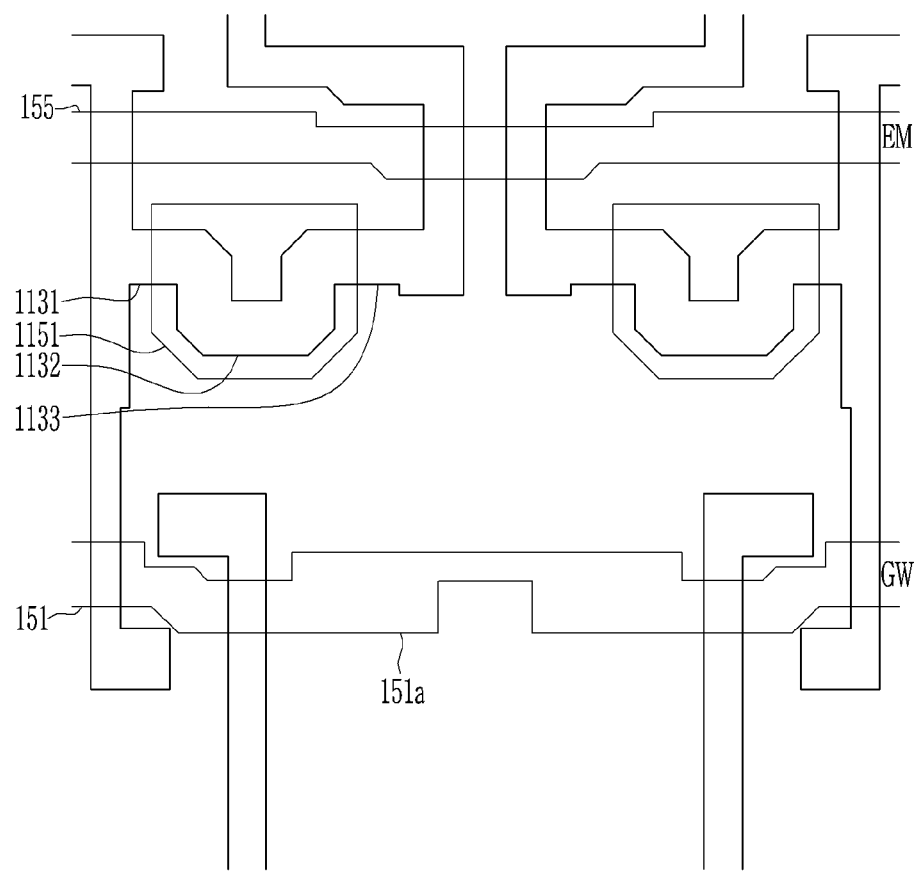

A first gate conductor including a gate electrode 1151 of the driving transistor T1 may be disposed on the first gate insulating layer 141. FIG. 6 illustrates a polycrystalline semiconductor layer and a first gate conductor together. The first gate conductor may have a single layered or multi-layered structure. The first gate conductor may include a metallic material such as molybdenum (Mo), aluminum (Al), copper (Cu), and/or titanium (Ti). The first gate conductor may further include a gate electrode of each of the second transistor T2, the fifth transistor T5, the sixth transistor T6, and the seventh transistor T7, as well as the driving transistor T1.

The gate electrode 1151 of the driving transistor T1 may overlap the channel 1132 of the driving transistor T1 in a plan view. The channel 1132 of the driving transistor T1 is covered by the gate electrode 1151 of the driving transistor T1.

The first gate conductor may further include a lower first scan line 151a and the light emission control line 155. The lower first scan line 151a and the light emission control line 155 may substantially extend in a horizontal direction in FIGS. 2 and 6. The lower first scan line 151a may be connected to the gate electrode of the second transistor T2. The lower first scan line 151a may be integrated with the gate electrode of the second transistor T2. The lower first scan line 151a may be connected to the gate electrode of the seventh transistor T7 disposed at the next pixel. That is, a bypass control line connected to the seventh transistor T7 may be integral with the previous first scan line 151. The gate electrode of the fifth transistor T5 and the gate electrode of the sixth transistor T6 may be connected to the light emission control line 155.

After the first gate conductor including the gate electrode 1151 of the driving transistor T1 is formed, a doping process may be performed. A portion of the polycrystalline semiconductor layer covered by the first gate conductor is not doped, and another portion of the polycrystalline semiconductor layer that is not covered by the first gate conductor is doped such that the doped portion may have the same characteristic as the conductor. In this case, a doping process may be performed with a p-type dopant, and thus, the driving transistor T1, the second transistor T2, the fifth transistor T5, the sixth transistor T6, and the seventh transistor T7 including the polycrystalline semiconductor layer may have p-type transistor characteristics.

A second gate insulating layer 142 may be disposed on the first gate conductor and the first gate insulating layer 141 including the gate electrode 1151 of the driving transistor T1. The second gate insulating layer 142 may have a single layered or multi-layered structure. The second gate insulating layer 142 may include an inorganic insulating material such as a silicon nitride (SiNx), a silicon oxide (SiOx), and a silicon oxynitride (SiOxNy).

Figure 7:
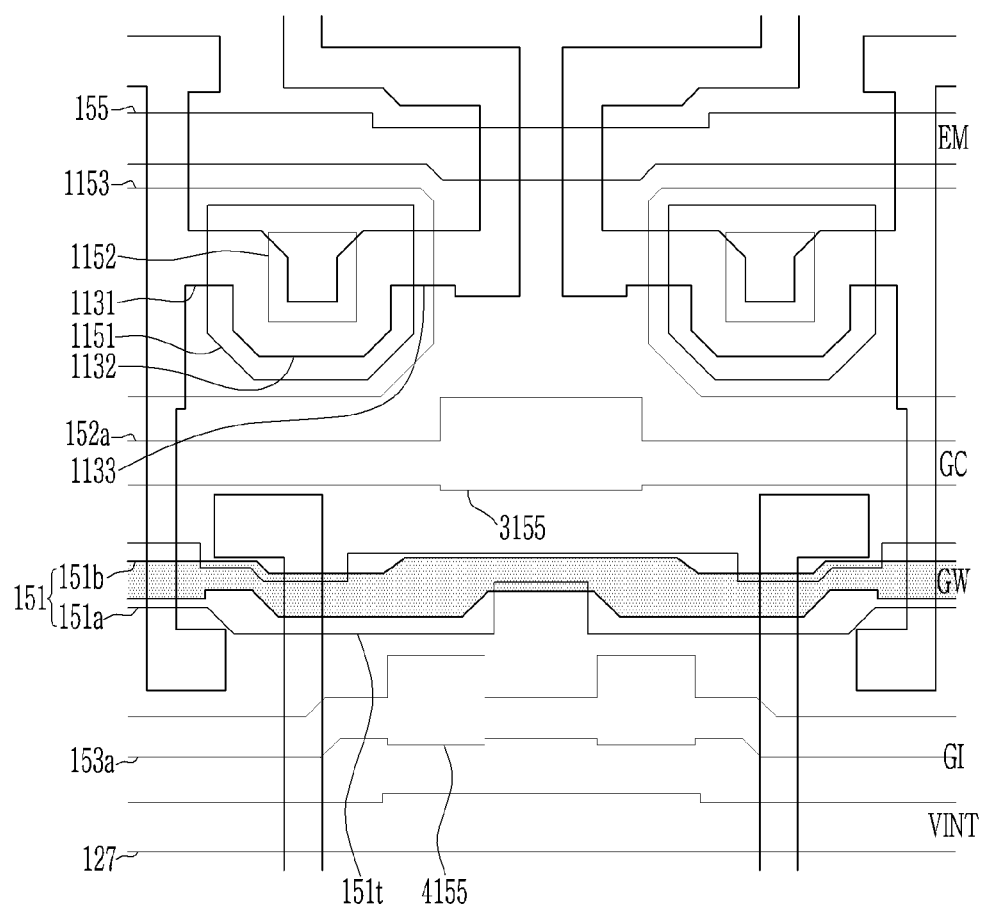

A second gate conductor including a first storage electrode 1153 of the storage capacitor Cst, a light blocking layer 3155 of the third transistor T3, and a light blocking layer 4155 of the fourth transistor T4 may be disposed on the second gate insulating layer 142. FIG. 7 illustrates a polycrystalline semiconductor layer, a first gate conductor, and a second gate conductor together. The second gate conductor may have a single layered or multi-layered structure. The second gate conductor may include a metallic material such as molybdenum (Mo), aluminum (Al), copper (Cu), and/or titanium (Ti).

The first storage electrode 1153 overlaps the gate electrode 1151 of the driving transistor T1 in a plan view to form the storage capacitor Cst together. That is, the first storage electrode 1153 corresponds to an upper storage electrode, and the gate electrode 1151 corresponds to a lower storage electrode (i.e., second storage electrode). An opening 1152 is defined in the first storage electrode 1153 of the storage capacitor Cst. The opening 1152 of the first storage electrode 1153 of the storage capacitor Cst may overlap the gate electrode 1151 of the driving transistor T1. The light blocking layer 3155 of the third transistor T3 may overlap a channel 3137 and a gate electrode 3151 of the third transistor T3 in a plan view. The light blocking layer 4155 of the fourth transistor T4 may overlap a channel 4137 and a gate electrode 4151 of the fourth transistor T4.

The second gate conductor may further include an upper first scan line 151b and a lower boost electrode 151t. The upper first scan line 151b may substantially (i.e., including small curved portion but mainly extended in a horizontal direction) extend in a horizontal direction as shown in FIG. 7. The upper first scan line 151b may be connected to the lower boost electrode 151t. The lower boost electrode 151t may extend from the upper first scan line 151b to be integrated therewith. That is, lower boost electrode 151t may be monolithic with the upper first scan line 151b. The upper first scan line 151b may overlap the lower first scan line 151a in a plan view. The upper first scan line 151b forms the first scan line 151 along with the lower first scan line 151a. The same signal may be applied to the upper first scan line 151b and the lower first scan line 151a. The upper first scan line 151b and the lower first scan line 151a may be connected to each other.

The second gate conductor may further include a lower second scan line 152a, a lower initialization control line 153a, and a first initialization voltage line 127. The lower second scan line 152a, the lower initialization control line 153a, and the first initialization voltage line 127 may substantially extend in a horizontal direction in FIG. 7. The lower second scan line 152a may be connected to the light blocking layer 3155 of the third transistor T3. The lower second scan line 152a may be integrally formed with the light blocking layer 3155 of the third transistor T3. The lower initialization control line 153a may be connected to the light blocking layer 4155 of the fourth transistor T4. The lower initialization control line 153a may be integrally formed with the light blocking layer 4155 of the fourth transistor T4.

A first interlayer-insulating layer 161 may be disposed on the second gate conductor which includes the first storage electrode 1153 of the storage capacitor Cst, the light blocking layer 3155 of the third transistor T3, and the light blocking layer 4155 of the fourth transistor T4. The first interlayer-insulating layer 161 may have a single layered or multi-layered structure. The first interlayer-insulating layer 161 may include an inorganic insulating material such as a silicon nitride (SiNx), a silicon oxide (SiOx), and a silicon oxynitride (SiOxNy).

Figure 8:
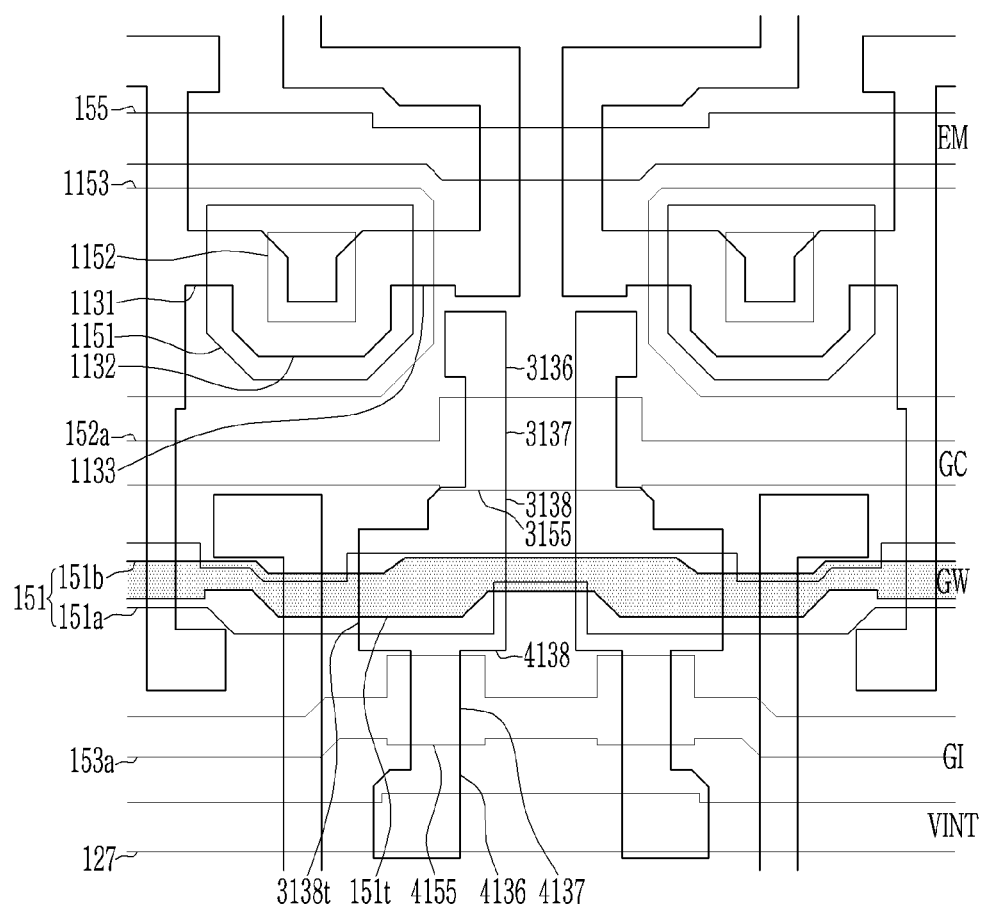

The oxide semiconductor layer including the channel 3137, the first electrode 3136, and the second electrode 3138 of the third transistor T3, and the channel 4137, the first electrode 4136, and the second electrode 4138 of the fourth transistor T4 may be disposed on the first interlayer-insulating layer 161. FIG. 8 illustrates a polycrystalline semiconductor layer, a first gate conductor, a second gate conductor, and an oxide semiconductor layer together.

The oxide semiconductor layer may include at least one of a primary metal oxide such as an indium (In) oxide, a tin (Sn) oxide, or a zinc (Zn) oxide; a binary metal oxide such as an In—Zn-based oxide, a Sn—Zn-based oxide, an Al—Zn-based oxide, a Zn—Mg-based oxide, a Sn—Mg-based oxide, an In—Mg-based oxide, or an In—Ga-based oxide; a ternary metal oxide such as an In—Ga—Zn-based oxide, an In—Al—Zn-based oxide, an In—Sn—Zn-based oxide, a Sn—Ga—Zn-based oxide, an Al—Ga—Zn-based oxide, a Sn—Al—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn based-oxide, an In—Ho—Zn-based oxide, an In—Er—Zn-based oxide, an In—Tm—Zn-based oxide, an In—Yb—Zn-based oxide, or an In—Lu—Zn-based oxide; and a quaternary metal oxide such as an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, or an In—Hf—Al—Zn-based oxide. For example, the oxide semiconductor layer may include an indium-gallium-zinc oxide ("IGZO") among the In—Ga—Zn-based oxide.

A channel 3137, a first electrode 3136, and a second electrode 3138 of the third transistor T3, and a channel 4137, a first electrode 4136, and a second electrode 4138 of the fourth transistor T4 may be connected to each other to be integrally formed. The first electrode 3136 and the second electrode 3138 of the third transistor T3 may be disposed at opposite sides of the channel 3137 of the third transistor T3, respectively. The first electrode 4136 and the second electrode 4138 of the fourth transistor T4 may be disposed at opposite sides of the channel 4137 of the fourth transistor T4, respectively. The second electrode 3138 of the third transistor T3 may be connected to the second electrode 4138 of the fourth transistor T4. The channel 3137 of the third transistor T3 may overlap the light blocking layer 3155 in a plan view (See FIG. 3). The channel 4137 of the fourth transistor T4 may overlap the light blocking layer 4155 in a plan view.

The oxide semiconductor layer may further include an upper boost electrode 3138t. The upper boost electrode 3138t may be connected to the second electrode 3138 of the third transistor T3. The upper boost electrode 3138t may be integrally formed with the second electrode 3138 of the third transistor T3. In other words, the upper boost electrode 3138t may be monolithic with the second electrode 3138 of the third transistor T3. The upper boost electrode 3138t may be connected to the second electrode 4138 of the fourth transistor T4. The upper boost electrode 3138t may be integrally formed with the second electrode 4138 of the fourth transistor T4. The upper boost electrode 3138t may overlap the lower boost electrode 151t. The capacitance of the boost capacitor Cbt may be determined by an overlapping area of the lower boost electrode 151t and the upper boost electrode 3138t of the boost capacitor Cbt, and by a thickness (i.e., distance DTp) of the first interlayer-insulating layer 161 disposed between the lower boost electrode 151t and the upper boost electrode 3138t in a thickness direction of the substrate 110.

In the display device according to the embodiment, the boost capacitor Cbt includes a lower boost electrode 151t made of the second gate conductor and an upper boost electrode 3138t included in the oxide semiconductor layer. In this case, the first interlayer-insulating layer 161 may be disposed between the lower boost electrode 151t and the upper boost electrode 3138t, and the lower boost electrode 151t and the upper boost electrode 3138t may overlap each other in a plan view.

Figure 11:
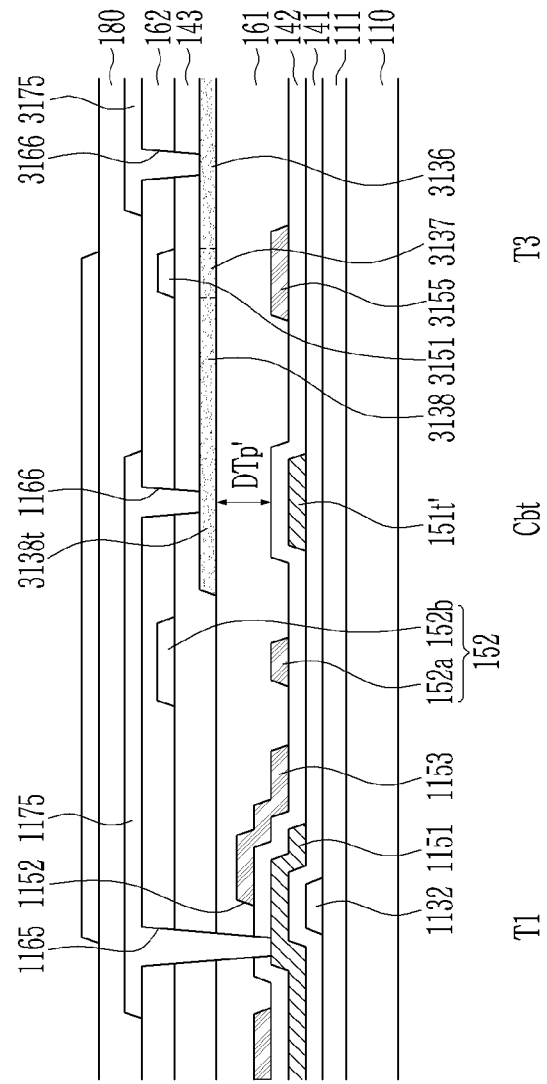
FIG. 11 illustrates a cross-sectional view of a display device according to a comparative example.

As a display device according to a comparative example having a structure that is partially different from that of the display device according to the embodiment, as shown in FIG. 11, a case in which the lower boost electrode 151t' of the boost capacitor Cbt is made of the first gate conductor instead of the second gate conductor may be considered. FIG. 11 illustrates a cross-sectional view of a display device according to a comparative example. In this case, the second gate insulating layer 142 and the first interlayer-insulating layer 161 may be disposed between the lower boost electrode 151t' and the upper boost electrode 3138t. In the display device according to the comparative example, since more insulating layers than that of the display device according to the embodiment are disposed between the lower boost electrode 151t' and the upper boost electrode 3138t, a distance DTp' between the lower boost electrode 151t' and the upper boost electrode 3138t may increase. That is the distance DTp' in the comparative example is longer than the distance DTp in the embodiment. Therefore, in order to secure the same capacitance of the boost capacitor Cbt with that of the embodiment, the overlapping area of the lower boost electrode 151t' and the upper boost electrode 3138t in the comparative example should be larger than that of the embodiment. Accordingly, a size of each pixel increases in the comparative example, and then a resolution of a display device according to the comparative example may decrease compared to that of the embodiment.

In the display device according to the embodiment, a distance DTp between the lower boost electrode 151t and the upper boost electrode 3138t may be further shortened compared to that of the display device according to the comparative example. Therefore, while maintaining the same capacitance of the boost capacitor Cbt with that of the comparative example, the overlapping area of the lower boost electrode 151t and the upper boost electrode 3138t in the embodiment may be smaller than that of the comparative example. Accordingly, a size of each pixel in the embodiment decreases, and then a resolution of a display device according to the embodiment may increase compared to that of the comparative example.

A third gate insulating layer 143 may be disposed on the oxide semiconductor layer which includes the channel 3137, the first electrode 3136, and the second electrode 3138 of the third transistor T3, and the channel 4137, the first electrode 4136, and the second electrode 4138 of the fourth transistor T4. The third gate insulating layer 143 may be disposed on an entire surface of the oxide semiconductor layer and the first interlayer-insulating layer 161. Therefore, the third gate insulating layer 143 may cover upper and lateral surfaces of the channel 3137, the first electrode 3136, and the second electrode 3138 of the third transistor T3, and of the channel 4137, the first electrode 4136, and the second electrode 4138 of the fourth transistor T4. However, the present embodiment according to the invention is not limited thereto, and the third gate insulating layer 143 may not be disposed on the entire surface of the oxide semiconductor layer and the first interlayer-insulating layer 161. In another embodiment, for example, the third gate insulating layer 143 may overlap the channel 3137 of the third transistor T3, and it may not overlap the first electrode 3136 and the second electrode 3138 of the third transistor T3 in a plan view. In addition, the third gate insulating layer 143 may overlap the channel 4137 of the fourth transistor T4, and the third gate insulating layer 143 may not overlap the first electrode 4136 and the second electrode 4138 of the fourth transistor T4 in a plan view. The third gate insulating layer 143 may have a single layered or multi-layered structure. The third gate insulating layer 143 may include an inorganic insulating material such as a silicon nitride (SiNx), a silicon oxide (SiOx), and a silicon oxynitride (SiOxNy).

The third gate insulating layer 143 may define a first opening 2165 and a second opening 2166. The first opening 2165 may overlap the lower first scan line 151a in a plan view. In this case, the first opening 2165 may not overlap the upper first scan line 151b in the plan view. The first opening 2165 may be further defined in the first interlayer-insulating layer 161 and the second gate insulating layer 142. The second opening 2166 may overlap the upper first scan line 151b. The second opening 2166 may overlap the lower first scan line 151a in a plan view. The second opening 2166 may be further defined in the first interlayer-insulating layer 161.

Figure 9:
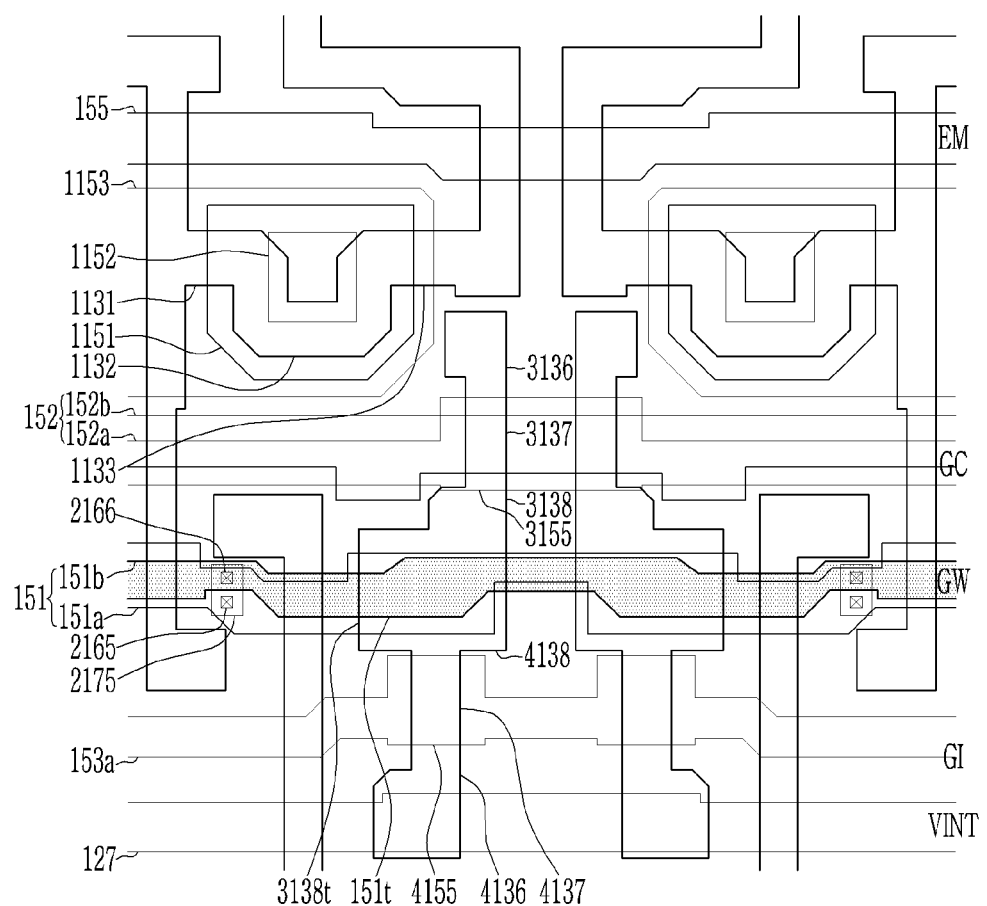

A third gate conductor including the gate electrode 3151 of the third transistor T3 and the gate electrode 4151 of the fourth transistor T4 can be positioned on the third gate insulating layer 143. FIG. 9 illustrates a polycrystalline semiconductor layer, a first gate conductor, a second gate conductor, an oxide semiconductor layer, and a third gate conductor together. The third gate conductor may have a single layered or multi-layered structure. The third gate conductor may include a metallic material such as molybdenum (Mo), aluminum (Al), copper (Cu), and/or titanium (Ti).

The gate electrode 3151 of the third transistor T3 may overlap the channel 3137 of the third transistor T3. The gate electrode 3151 of the third transistor T3 may overlap the light blocking layer 3155 of the third transistor T3 in a plan view.

The gate electrode 4151 of the fourth transistor T4 may overlap the channel 4137 of the fourth transistor T4. The gate electrode 4151 of the fourth transistor T4 may overlap the light blocking layer 4155 of the fourth transistor T4 in a plan view.

The third gate conductor may further include an upper second scan line 152b, an upper initialization control line 153b, and a third connection electrode 2175.

The upper second scan line 152b and the upper initialization control line 153b may substantially extend in a horizontal direction as shown in FIG. 9. The upper second scan line 152b forms the second scan line 152 together with the lower second scan line 152a. The upper second scan line 152b may be connected to the gate electrode 3151 of the third transistor T3. The upper second scan line 152b may be integrally formed with the gate electrode 3151 of the third transistor T3. The upper initialization control line 153b forms the initialization control line 153 together with the lower initialization control line 153a. The upper initialization control line 153b may be connected to the gate electrode 4151 of the fourth transistor T4. The upper initialization control line 153b may be integrally formed with the gate electrode 4151 of the fourth transistor T4.

The third connection electrode 2175 may overlap the lower first scan line 151a (See FIG. 4). The third connection electrode 2175 may be connected to the lower first scan line 151a through the first opening 2165. The third connection electrode 2175 may overlap the upper first scan line 151b in a plan view. The third connection electrode 2175 may be connected to the upper first scan line 151b through the second opening 2166. Accordingly, the lower first scan line 151a and the upper first scan line 151b may be connected by the third connection electrode 2175. The same signal may be applied to the lower first scan line 151a and the upper first scan line 151b. Since the lower first scan line 151a and the upper first scan line 151b are connected by the third connection electrode 2175, resistance of the first scan line 151 may be decreased. The third connection electrode 2175 may be disposed one by one for each pixel. However, the present invention is not limited thereto, and the position of the third connection electrode 2175 may be variously changed. In another embodiment, for example, the third connection electrode 2175 may be disposed one by one for every two pixels or for every four pixels. Alternatively, in some cases, the third connection electrode 2175 may be omitted.

After the third gate conductor including the gate electrode 3151 of the third transistor T3 and the gate electrode 4151 of the fourth transistor T4 are formed, a doping process may be performed. A portion of the oxide semiconductor layer that is covered by the third gate conductor is not doped, and another portion of the oxide semiconductor layer that is not covered by the third gate conductor is doped, so that the doped portion may have the same characteristics as the conductor. The channel 3137 of the third transistor T3 may be disposed under the gate electrode 3151 to overlap the gate electrode 3151 in a plan view. The first electrode 3136 and the second electrode 3138 of the third transistor T3 may not overlap the gate electrode 3151. The channel 4137 of the fourth transistor T4 may be disposed under the gate electrode 4151 to overlap the gate electrode 4151. The first electrode 4136 and the second electrode 4138 of the fourth transistor T4 may not overlap the gate electrode 4151 in a plan view. The upper boost electrode 3138t may not overlap the third gate conductor. The doping process of the oxide semiconductor layer may be performed with an n-type dopant, and the third transistor T3 and the fourth transistor T4 including the oxide semiconductor layer may have an n-type transistor characteristic.

A second interlayer-insulating layer 162 may be disposed on the third gate conductor which includes the gate electrode 3151 of the third transistor T3 and the gate electrode 4151 of the fourth transistor T4. The second interlayer-insulating layer 162 may have a single layered or multi-layered structure. The second interlayer-insulating layer 162 may include an inorganic insulating material such as a silicon nitride (SiNx), a silicon oxide (SiOx), and a silicon oxynitride (SiOxNy). The second interlayer-insulating layer 162 may define a third opening 1165, a fourth opening 1166, a fifth opening 3165, and a sixth opening 3166.

The third opening 1165 may overlap at least a portion of the gate electrode 1151 of the driving transistor T1 in a plan view. The third opening 1165 may be further defined in the third gate insulating layer 143, the first interlayer-insulating layer 161, and the second gate insulating layer 142. The third opening 1165 may overlap the opening 1152 of the first storage electrode 1153 in a plan view. The third opening 1165 may be disposed inside the opening 1152 of the first storage electrode 1153. The fourth opening 1166 may overlap at least a portion of the boost capacitor Cbt. The fourth opening 1166 may be further defined in the third gate insulating layer 143.

The fifth opening 3165 may overlap at least a portion of the second electrode 1133 of the driving transistor T1. The fifth opening 3165 may be further defined in the third gate insulating layer 143, the first interlayer-insulating layer 161, the second gate insulating layer 142, and the first gate insulating layer 141. The sixth opening 3166 may overlap at least a portion of the first electrode 3136 of the third transistor T3. The sixth opening 3166 may be further defined in the third gate insulating layer 143.

Figure 10:
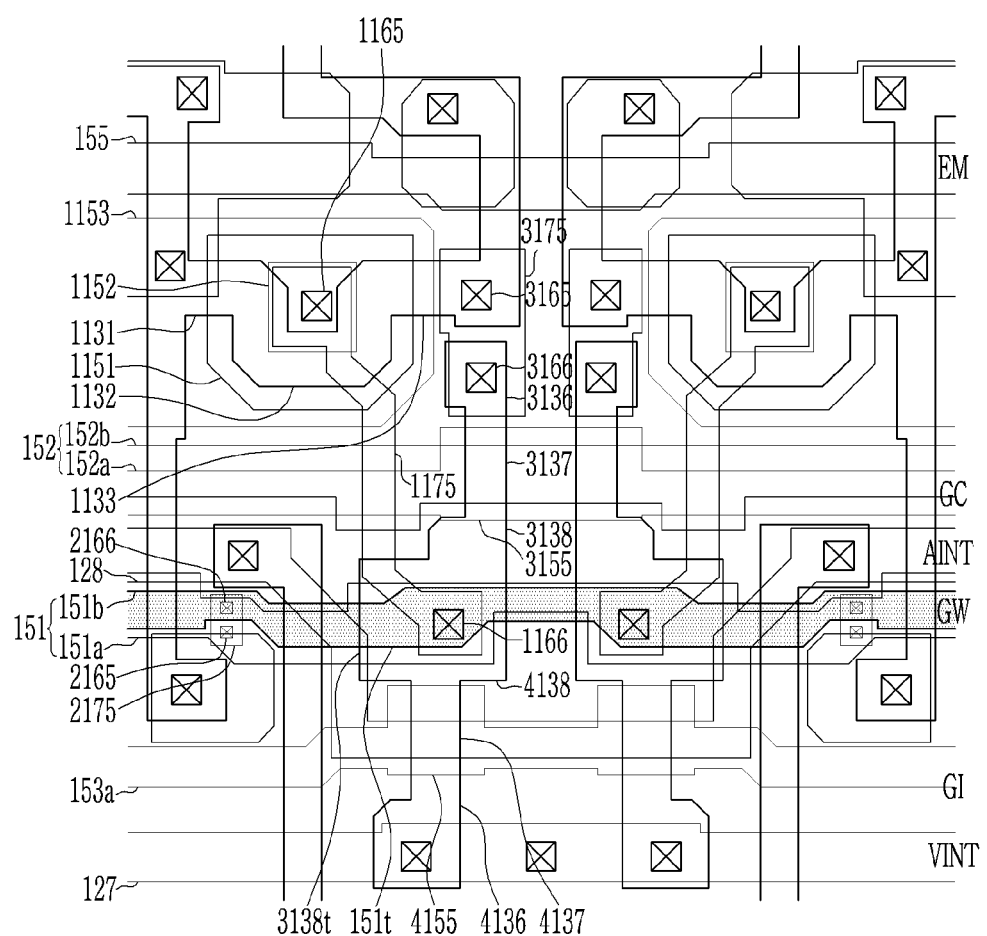

A first data conductor including a first connection electrode 1175 and a second connection electrode 3175 may be positioned on the second interlayer-insulating layer 162. FIG. 10 illustrates a polycrystalline semiconductor layer, a first gate conductor, a second gate conductor, an oxide semiconductor layer, a third gate conductor, and a first data conductor together. The first data conductor may have a single layered or multi-layered structure. The first data conductor may include aluminum (Al), platinum (Pt), palladium (Pd), silver (Ag), magnesium (Mg), gold (Au), nickel (Ni), neodymium (Nd), iridium (Ir), chromium (Cr), nickel (Ni), calcium (Ca), molybdenum (Mo), titanium (Ti), tungsten (W), and/or copper (Cu).

The first connection electrode 1175 may overlap the gate electrode 1151 of the driving transistor T1 in a plan view. The first connection electrode 1175 may be connected to the gate electrode 1151 of the driving transistor T1 through the third opening 1165 and the opening 1152 of the first storage electrode 1153. The first connection electrode 1175 may overlap the boost capacitor Cbt. The first connection electrode 1175 may be connected to the upper boost electrode 3138t of the boost capacitor Cbt through the fourth opening 1166. Accordingly, the gate electrode 1151 of the driving transistor T1 and the upper boost electrode 3138t of the boost capacitor Cbt may be connected by the first connection electrode 1175. In this case, the gate electrode 1151 of the driving transistor T1 may be connected to the second electrode 3138 of the third transistor T3 and the second electrode 4138 of the fourth transistor T4 by the first connection electrode 1175.

The second connection electrode 3175 may overlap the second electrode 1133 of the driving transistor T1. The second connection electrode 3175 may be connected to the second electrode 1133 of the driving transistor T1 through the fifth opening 3165. The second connection electrode 3175 may overlap the first electrode 3136 of the third transistor T3 in a plan view. The second connection electrode 3175 may be connected to the first electrode 3136 of the third transistor T3 through the sixth opening 3166. Accordingly, the second electrode 1133 of the driving transistor T1 and the first electrode 3136 of the third transistor T3 may be connected by the second connection electrode 3175.

The first data conductor may further include a second initialization voltage line 128. The second initialization voltage line 128 may substantially extend in a horizontal direction as shown in FIG. 10.

A third interlayer-insulating layer 180 may be disposed on the first data conductor which includes the first connection electrode 1175 and the second connection electrode 3175. The third interlayer-insulating layer 180 may have a single layered or multi-layered structure. The third interlayer-insulating layer 180 may include an organic insulating material such as a general-purpose polymer such as poly (methylmethacrylate) ("PMMA") or polystyrene ("PS"), a polymer derivative having a phenolic group, an acryl-based polymer, an imide-based polymer, a polyimide, an acryl-based polymer, and a siloxane-based polymer.

A second data conductor including the data line 171 and the driving voltage line 172 may be disposed on the third interlayer-insulating layer 180. The data line 171 and the driving voltage line 172 may substantially extend in a vertical direction as shown in FIG. 2. The data line 171 may be connected to the second transistor T2. The driving voltage line 172 may be connected to the fifth transistor T5. In addition, the driving voltage line 172 may be connected to the first storage electrode 1153.

The second data conductor may have a single layered or multi-layered structure. The second data conductor may include aluminum (Al), platinum (Pt), palladium (Pd), silver (Ag), magnesium (Mg), gold (Au), nickel (Ni), neodymium (Nd), iridium (Ir), chromium (Cr), nickel (Ni), calcium (Ca), molybdenum (Mo), titanium (Ti), tungsten (W), and/or copper (Cu).

Although not shown, a passivation layer may be disposed above the data line 171 and the driving voltage line 172, and an anode electrode of the light emitting diode LED may be disposed above the passivation layer. The passivation layer may include an organic insulating material such as a general-purpose polymer such as poly(methylmethacrylate) (PMMA) or polystyrene (PS), a polymer derivative having a phenolic group, an acryl-based polymer, an imide-based polymer, a polyimide, an acryl-based polymer, and a siloxane-based polymer. The anode electrode of the light emitting diode LED may be connected to the sixth transistor T6 to receive an output current of the driving transistor T1. A partition wall may be disposed on the anode electrode. An opening may be defined in the partition wall, and the opening of the partition wall may overlap the anode electrode in a plan view. A light emitting element layer (not shown) may be disposed in the opening of the partition wall. A cathode electrode of the light emitting diode LED may be disposed on the light emitting element layer and on the partition wall. The anode electrode, the light emitting element layer, and the cathode electrode form the light emitting diode LED.

As described above, in the display device according to the embodiment, the driving transistor T1 may include a polycrystalline semiconductor, and the third transistor T3 and the fourth transistor T4 may include an oxide semiconductor. As described above, by making the third transistor T3 and the fourth transistor T4 to contain a semiconductor material that is different from that of the driving transistor T1, they may be more stably driven, and their reliability may be improved.

Hereinafter, pixels of a display device according to an embodiment will be described with reference to FIG. 12 and FIG. 13.

Figure 12:
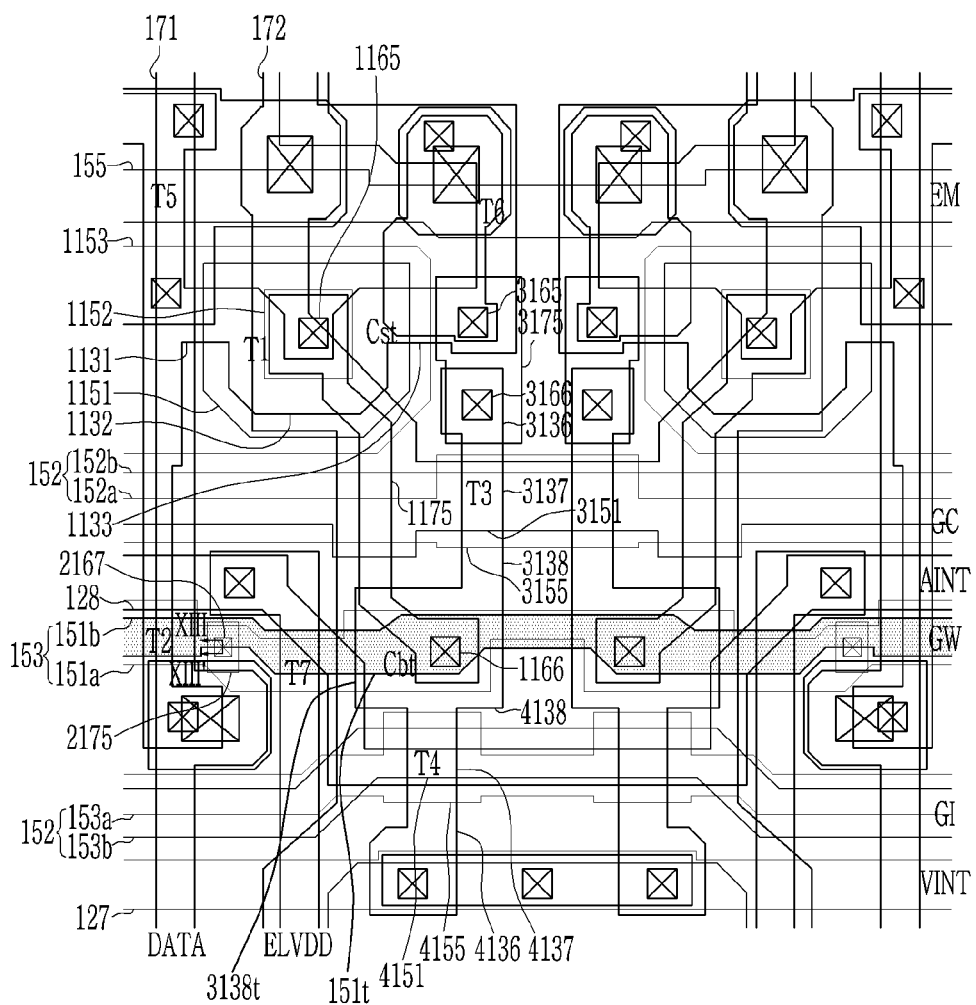
FIG. 12 illustrates a top plan view of pixels of a display device according to another embodiment.
Figure 13:
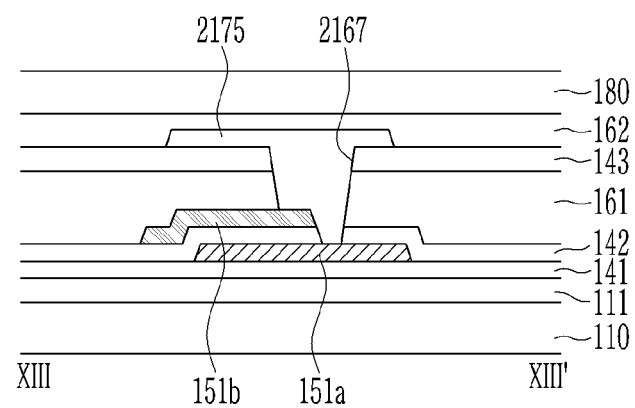
FIG. 13 illustrates a cross-sectional view taken along line XIII-XIII of FIG. 12.

Since many portions of the display device according to the embodiment shown in FIG. 12 and FIG. 13 are the same as those of the display device according to the embodiment shown in FIG. 1 to FIG. 10, a repeated description thereof will be omitted. In the present embodiment, a connection structure of the lower first scan line and the upper first scan line is different from that of the above-described embodiment, and will be further described below.

FIG. 12 illustrates a top plan view of pixels of a display device according to another embodiment, and FIG. 13 illustrates a cross-sectional view taken along line XIII-XIII of FIG. 12.

As shown in FIG. 12 and FIG. 13, the display device according to the embodiment includes a plurality of transistors T1, T2, T3, T4, T5, T6, and T7, a storage capacitor Cst, a boost capacitor Cbt, and a light emitting diode (not shown), connected to a plurality of wires 127, 128, 151, 152, 153, 154, 155, 171, and 172.

In the above-described embodiment (See FIG. 4), an opening for connecting the third connection electrode 2175 and the lower first scan line 151a and an opening for connecting the third connection electrode 2175 and the upper first scan line 151b are separately formed. However, in the present embodiment, a single opening 2167 for connecting the third connection electrode 2175 to both the lower first scan line 151a and upper first scan line 151b is defined. The opening 2167 may overlap the third connection electrode 2175, the lower first scan line 151a, and the upper first scan line 151b in a plan view. The opening 2167 may be defined in the second gate insulating layer 142, the first interlayer-insulating layer 161, and the third gate insulating layer 143. An upper surface of the lower first scan line 151a may be exposed by the opening 2167. In addition, upper and/or lateral surfaces of the upper first scan line 151b may be exposed by the opening 2167. The third connection electrode 2175 may fill the opening 2167. Accordingly, the third connection electrode 2175 may be connected to the upper surface of the lower first scan line 151a, and may be connected to the upper surface and/or the lateral surface of the upper first scan line 151b. That is, the lower first scan line 151a and the upper first scan line 151b may be connected by the third connection electrode 2175.

Hereinafter, a display device according to an embodiment will be described with reference to FIG. 14.

Figure 14:
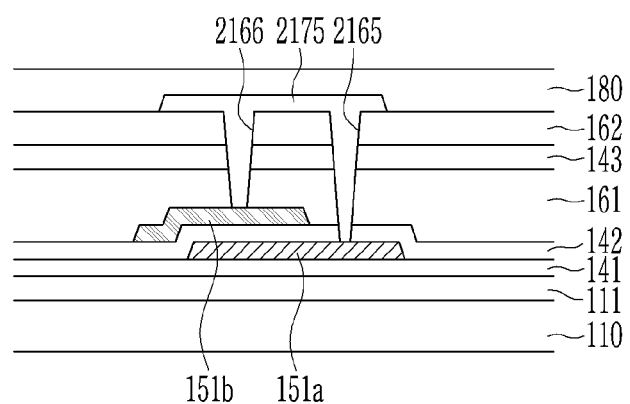
FIG. 14 illustrates a cross-sectional view of a display device according to another embodiment.

Since many portions of the display device according to the embodiment shown in FIG. 14 are the same as those of the display device according to the embodiment shown in FIG. 1 to FIG. 10, a repeated description thereof will be omitted. In the present embodiment, a position in a cross-sectional view at which the third connection electrode is formed is different from that of the above-described embodiment, and will be further described below.

FIG. 14 illustrates a cross-sectional view of a display device according to another embodiment.

As shown in FIG. 14, the lower first scan line 151a and the upper first scan line 151b may be connected by the third connection electrode 2175.

In the previous embodiment (FIG. 4), the third connection electrode 2175 is made of the third gate conductor. In the present embodiment, the third connection electrode 2175 may be made of the first data conductor. The third connection electrode 2175 may be disposed on the second interlayer-insulating layer 162. The second interlayer-insulating layer 162 may define the first opening 2165 and the second opening 2166. The first opening 2165 may overlap the lower first scan line 151a. In this case, the first opening 2165 may not overlap the upper first scan line 151b in a plan view. The first opening 2165 may be further defined in the third gate insulating layer 143, the first interlayer-insulating layer 161, and the second gate insulating layer 142. The second opening 2166 may overlap the upper first scan line 151b. The second opening 2166 may overlap the lower first scan line 151a in a plan view. The second opening 2166 may be further defined in the third gate insulating layer 143 and the first interlayer-insulating layer 161. The third connection electrode 2175 may be connected to the lower first scan line 151a through the first opening 2165. The third connection electrode 2175 may be connected to the upper first scan line 151b through the second opening 2166. Accordingly, the lower first scan line 151a and the upper first scan line 151b may be connected by the third connection electrode 2175.

In the display device according to the embodiment, the case in which the third connection electrode 2175 is disposed on the third gate conductor and the first data conductor has been described, but the present invention is not limited thereto. In another embodiment, for example, the third connection electrode 2175 may be made of the second data conductor.

Hereinafter, a display device according to an embodiment will be described with reference to FIG. 15.

Figure 15:
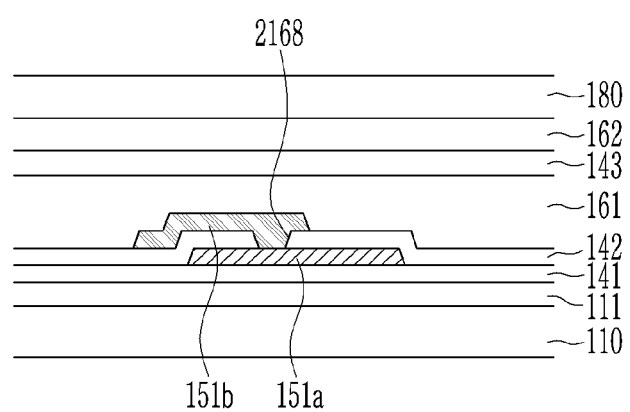
FIG. 15 illustrates a cross-sectional view of a display device according to still another embodiment.

Since many portions of the display device according to the embodiment shown in FIG. 15 are the same as those of the display device according to the embodiment shown in FIG. 1 to FIG. 10, a repeated description thereof will be omitted. In the present embodiment, a connection structure of the lower first scan line and the upper first scan line is different from that of the above-described embodiment, and will be further described below.

FIG. 15 illustrates a cross-sectional view of a display device according to still another embodiment.

As shown in FIG. 15, the lower first scan line 151a and the upper first scan line 151b may be directly connected to each other.

In the previous embodiments (See FIGS. 4, 13 and 14), the lower first scan line 151*a* and the upper first scan line 151*b* are connected by the third connection electrode 2175. However, in the present embodiment, the lower first scan line 151*a* and the upper first scan line 151*b* are not connected through a separate conductor, but may be directly connected.

The lower first scan line 151*a* and the upper first scan line 151*b* may at least partially overlap each other in a plan view. The second gate insulating layer 142 may be disposed between the lower first scan line 151*a* and the upper first scan line 151*b*. The second gate insulating layer 142 may define an opening 2168. The opening 2168 may overlap the lower first scan line 151*a* and the upper first scan line 151*b* in a plan view. The upper first scan line 151*b* may be connected to the lower first scan line 151*a* through the opening 2168. That is, the upper first scan line 151*b* may contact the lower first scan line 151*a* through the opening 2168.

Hereinafter, pixels of a display device according to an embodiment will be described with reference to FIG. 16 and FIG. 17.

Figure 16:
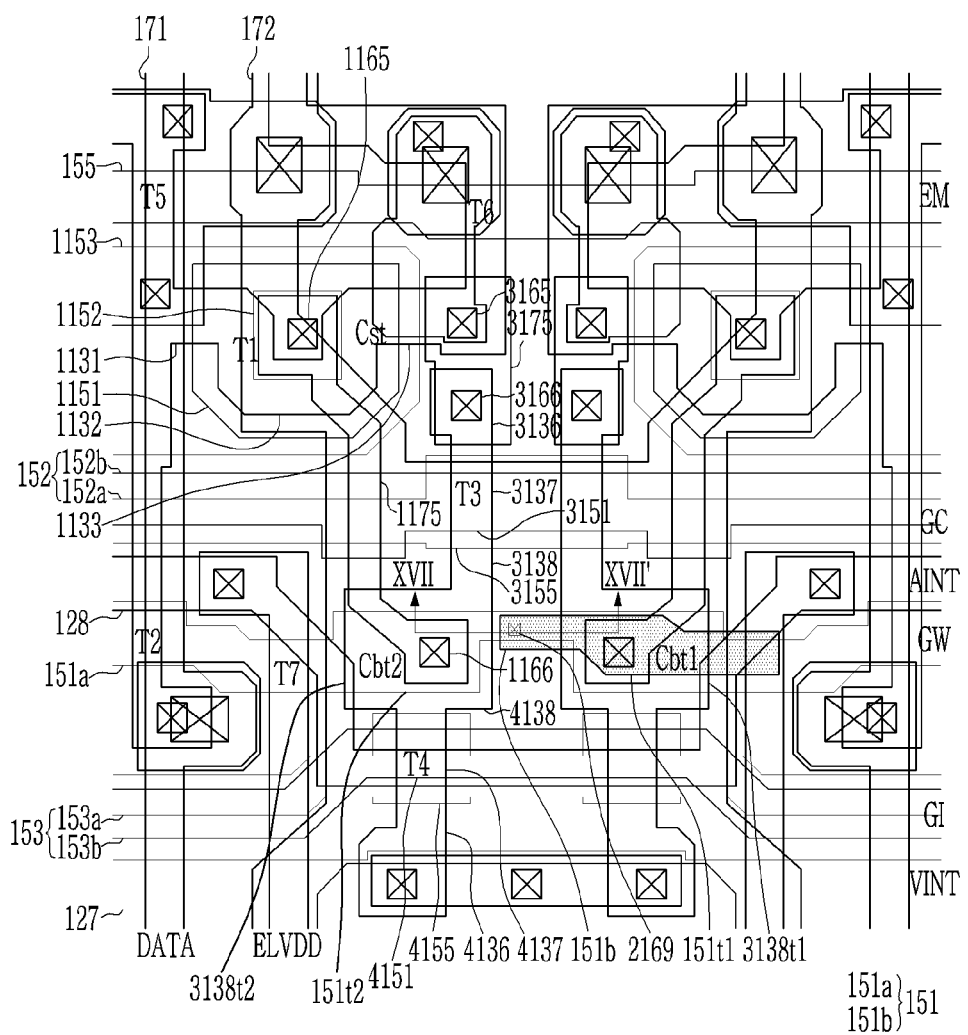
FIG. 16 illustrates a top plan view of pixels of a display device according to still another embodiment.

Since many portions of the display device according to the embodiment shown in FIG. 16 are the same as those of the display device according to the embodiment shown in FIG. 1 to FIG. 10, a repeated description thereof will be omitted. In the present embodiment, features in which lower boost electrodes of some pixels are made of the second gate conductor and lower boost electrodes of some other pixels are made of the first gate conductor are different from the previous embodiment, and will be further described below.

Figure 17:
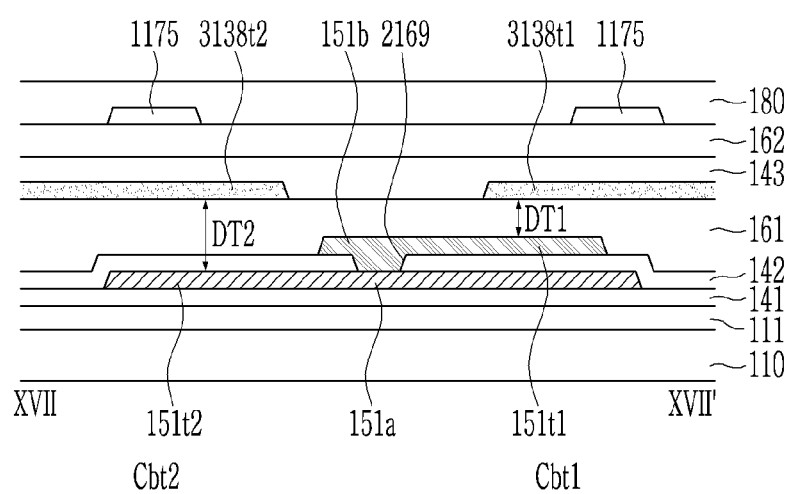
FIG. 17 illustrates a cross-sectional view taken along line XVII-XVII of FIG. 16.

FIG. 16 illustrates a top plan view of pixels of a display device according to still another embodiment, and FIG. 17 illustrates a cross-sectional view taken along line XVII-XVII of FIG. 16.

As shown in FIG. 16 and FIG. 17, the display device according to the embodiment includes a plurality of transistors T1, T2, T3, T4, T5, T6, and T7, a storage capacitor Cst, a boost capacitor Cbt, and a light emitting diode (not shown), connected to a plurality of wires 127, 128, 151, 152, 153, 154, 155, 171, and 172.

In the previous embodiments, the upper first scan line 151*b* extends to pass all pixels, and the lower boost electrode 151*t* is connected to the upper first scan line 151*b* in all pixels. However, in the present embodiment, the upper first scan line 151*b* may be disposed at only some pixels, and the upper first scan line 151*b* may not be disposed at the other pixels. In the present embodiment, the lower boost electrode may include a first lower boost electrode 151*t*1 and a second lower boost electrode 151*t*2, and the upper boost electrode may include a first upper boost electrode 3138*t*1 and a second upper boost electrode 3138*t*2. The first lower boost electrode 151*t*1 may be connected to the upper first scan line 151*b* in a pixel in which the upper first scan line 151*b* is disposed. The upper first scan line 151*b* may overlap the lower first scan line 151*a* in a plan view. The second gate insulating layer 142 may be disposed between the lower first scan line 151*a* and the upper first scan line 151*b*. The second gate insulating layer 142 may define an opening 2169. The opening 2169 may overlap the lower first scan line 151*a* and the upper first scan line 151*b*. The upper first scan line 151*b* may be connected to the lower first scan line 151*a* through the opening 2169.

In the present embodiment, left and right pixels are substantially symmetrical except for that the upper first scan line 151*b* is disposed only in the right pixel, and is not disposed in the left pixel. In the right pixel (See FIG. 17), the first lower boost electrode 151*t*1 is connected to the upper first scan line 151*b*, and in the left pixel, the second lower boost electrode 151*t*2 is connected to the lower first scan line 151*a*. In the right pixel, the first lower boost electrode 151*t*1 extends from and is integrated with the upper first scan line 151*b*, and in the left pixel, the second lower boost electrode 151*t*2 extends from and is integrated with the lower first scan line 151*a*. That is, the second lower boost electrode 151*t*2 is monolithic with the lower first scan line 151*a*. In the right pixel, the first lower boost electrode 151*t*1 may be made of the second gate conductor, and in the left pixel, the second lower boost electrode 151*t*2 may be made of the first gate conductor. In the right pixel, the first interlayer-insulating layer 161 may be disposed between the first lower boost electrode 151*t*1 and the first upper boost electrode 3138*t*1. In the left pixel, the first interlayer-insulating layer 161 and the second gate insulating layer 142 may be disposed between the second lower boost electrode 151*t*2 and the second upper boost electrode 3138*t*2. Accordingly, a distance DTI between the first lower boost electrode 151*t*1 and the first upper boost electrode 3138*t*1 in the right pixel may be shorter than a distance DT2 between the second lower boost electrode 151*t*2 and the second upper boost electrode 3138*t*2 in the left pixel. Therefore, a capacitance of the first boost capacitor Cbt1 (formed by the first lower boost electrode 151*t*1 and the first upper boost electrode 3138*t*1) of the right pixel may be different from that of the second boost capacitor Cbt2 (formed by the second lower boost electrode 151*t*2 and the second upper boost electrode 3138*t*2) of the left pixel. The capacitance of the first boost capacitor Cbt1 of the right pixel may be larger than that of the second boost capacitor Cbt2 of the left pixel.

The display device according to the embodiment may include pixels displaying different colors. For example, the display device according to the embodiment may include a red pixel, a green pixel, and a blue pixel. However, this is only an example, and the display device may include pixels displaying colors other than red, green, and blue in another embodiment. In FIG. 16, the right pixel and the left pixel may be pixels displaying different colors. For example, the right pixel may be a red pixel, and the left pixel may be a green pixel or a blue pixel. Respective pixels may have different characteristics, and accordingly, desirable capacitances of the boost capacitors Cbt may be different. Therefore, the capacitances of the boost capacitors Cbt of some pixels may be designed to be large, and the capacitances of the boost capacitors Cbt of some other pixels may be designed to be small. In this case, when a pixel requires a boost capacitor Cbt having a relatively large capacitance, a structure of the second boost capacitor Cbt2 of the right pixel of FIG. 16 may be adopted. In addition, when a pixel requires a boost capacitor Cbt having a relatively small capacitance, a structure of the second boost capacitor Cbt2 of the left pixel of FIG. 16 may be adopted.

A ratio of the pixel having the same structure as the second boost capacitor Cbt2 of the left pixel to the pixel having the same structure as the first boost capacitor Cbt1 of the right pixel may be variously selected. For example, the ratio of the pixel having the same structure as the second boost capacitor Cbt2 of the left pixel to the pixel having the same structure as the first boost capacitor Cbt1 of the right pixel may be 1:1, 1:2, or 2:1.

Hereinafter, pixels of a display device according to an embodiment will be described with reference to FIG. 18 and FIG. 19.

Figure 18:
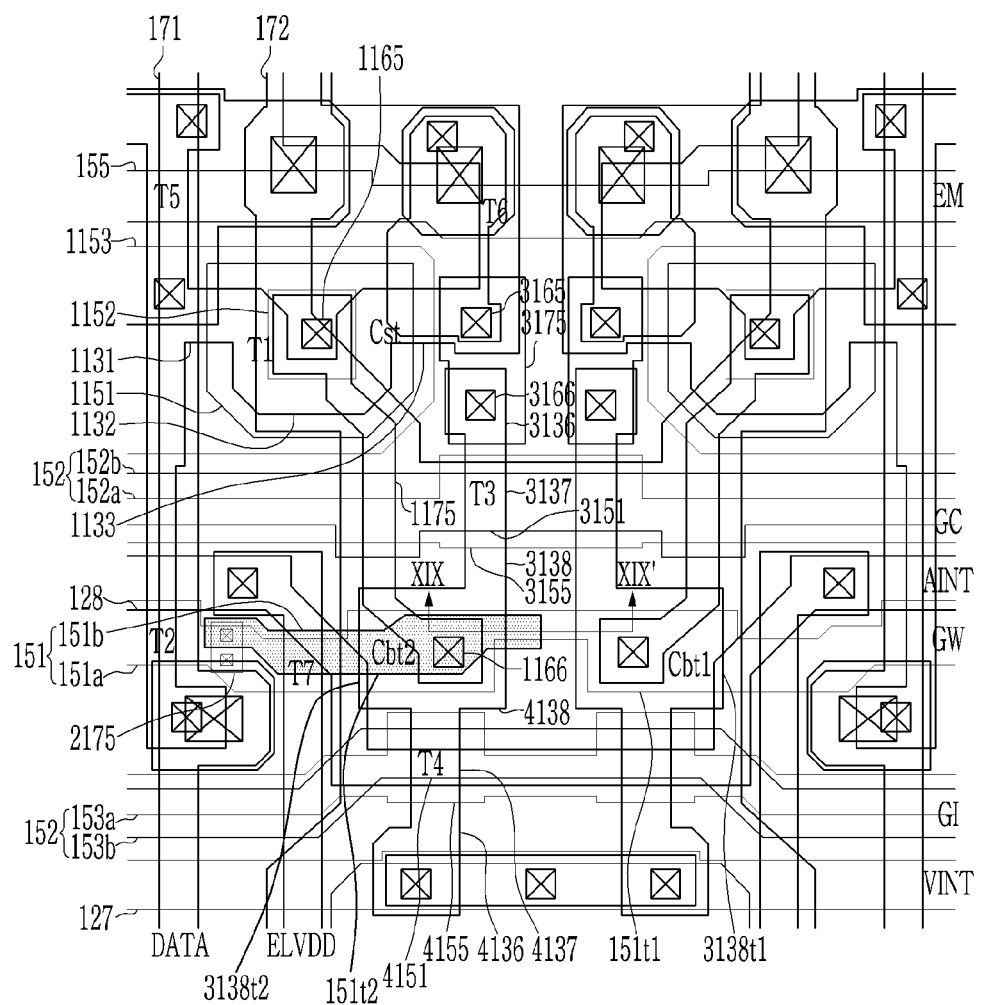
FIG. 18 illustrates a top plan view of pixels of a display device according to yet another embodiment.
Figure 19:
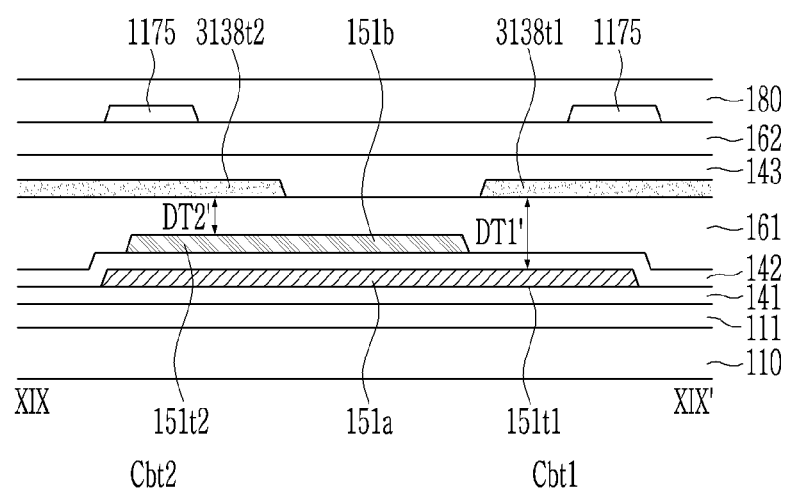
FIG. 19 illustrates a cross-sectional view taken along line XIX-XIX of FIG. 18.

Since many portions of the display device according to the embodiment shown in FIG. 18 and FIG. 19 are the same as those of the display device according to the embodiment shown in FIG. 16 and FIG. 17, a repeated description thereof will be omitted. The present embodiment differs from the previous embodiment in that the lower first scan line and the upper first scan line are connected by the third connection electrode, and will be further described below.

FIG. 18 illustrates a top plan view of pixels of a display device according to yet another embodiment, and FIG. 19 illustrates a cross-sectional view taken along line XIX-XIX of FIG. 18.

As shown in FIG. 18 and FIG. 19, the display device according to the embodiment includes a plurality of transistors T1, T2, T3, T4, T5, T6, and T7, a storage capacitor Cst, a boost capacitor Cbt, and a light emitting diode (not shown), connected to a plurality of wires 127, 128, 151, 152, 153, 154, 155, 171, and 172.

In the previous embodiment of FIG. 17, the upper first scan line 151b is directly connected to the lower first scan line 151a. However, in the present embodiment, the upper first scan line 151b is connected to the lower first scan line 151a through the third connection electrode 2175 (See FIG. 18). In the previous embodiment of FIG. 17, the upper first scan line 151b is disposed only in the right pixel, and is not disposed in the left pixel. However, in the present embodiment, the upper first scan line 151b is disposed only in the left pixel, and is not disposed in the right pixel (See FIG. 19).

In the right pixel, the first lower boost electrode 151t1 is connected to the lower first scan line 151a, and in the left pixel, the second lower boost electrode 151t2 is connected to the upper first scan line 151b. In the right pixel, the first lower boost electrode 151t1 extends from and is integrated with the lower first scan line 151a, and in the left pixel, the second lower boost electrode 151t2 extends from and is integrated with the upper first scan line 151b. In the right pixel, the first lower boost electrode 151t1 may be made of the first gate conductor, and in the left pixel, the second lower boost electrode 151t2 may be made of the second gate conductor. In the right pixel, the first interlayer-insulating layer 161 and the second gate insulating layer 142 may be disposed between the first lower boost electrode 151t1 and the first upper boost electrode 3138t1. In the left pixel, the first interlayer-insulating layer 161 may be disposed between the second lower boost electrode 151t2 and the second upper boost electrode 3138t2. Accordingly, a distance DT1' between the first lower boost electrode 151t1 and the first upper boost electrode 3138t1 in the right pixel may be longer than a distance DT2' between the second lower boost electrode 151t2 and the second upper boost electrode 3138t2 in the left pixel. Therefore, the capacitance of the first boost capacitor Cbt1 of the right pixel may be different from that of the second boost capacitor Cbt2 of the left pixel. The capacitance of the first boost capacitor Cbt1 (formed by the first lower boost electrode 151t1 and the first upper boost electrode 3138t1) of the right pixel may be smaller than that of the second boost capacitor Cbt2 (formed by the second lower boost electrode 151t2 and the second upper boost electrode 3138t2) of the left pixel.

Hereinafter, pixels of a display device according to an embodiment will be described with reference to FIG. 20 and FIG. 21.

Figure 20:
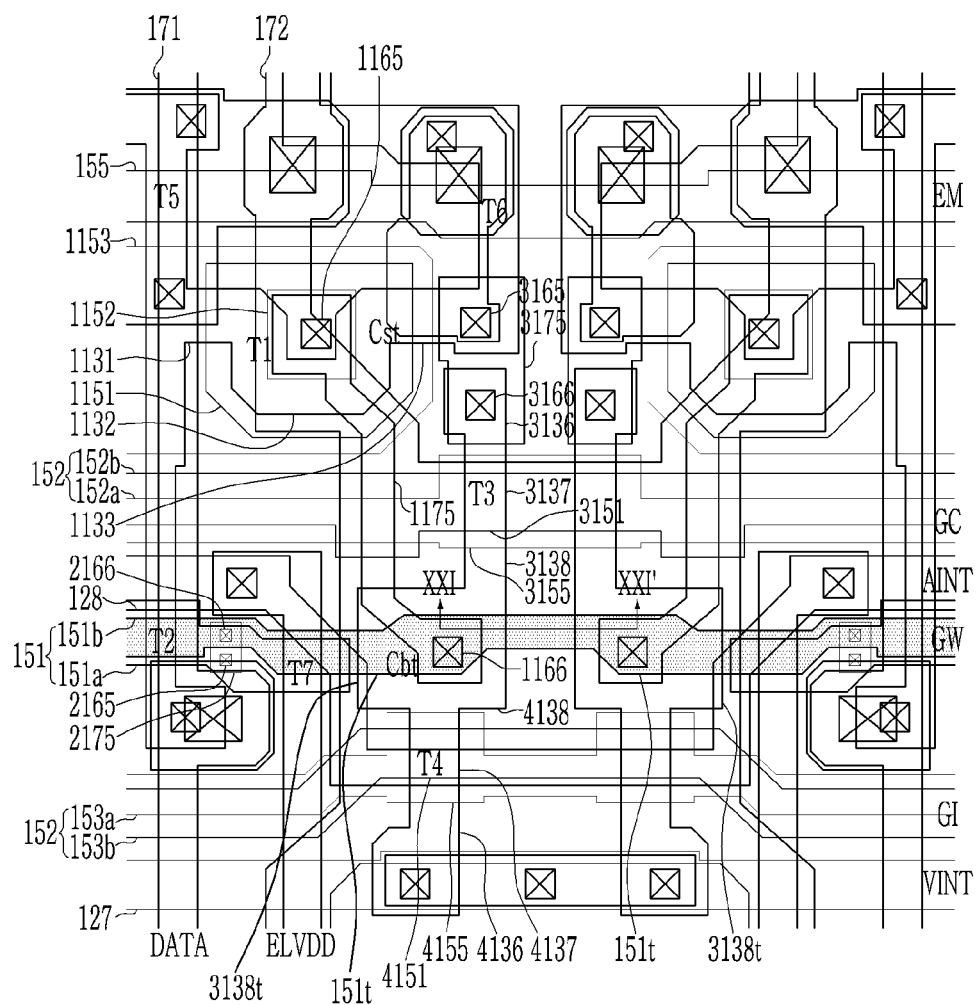
FIG. 20 illustrates a top plan view of pixels of a display device according to another embodiment.
Figure 21:
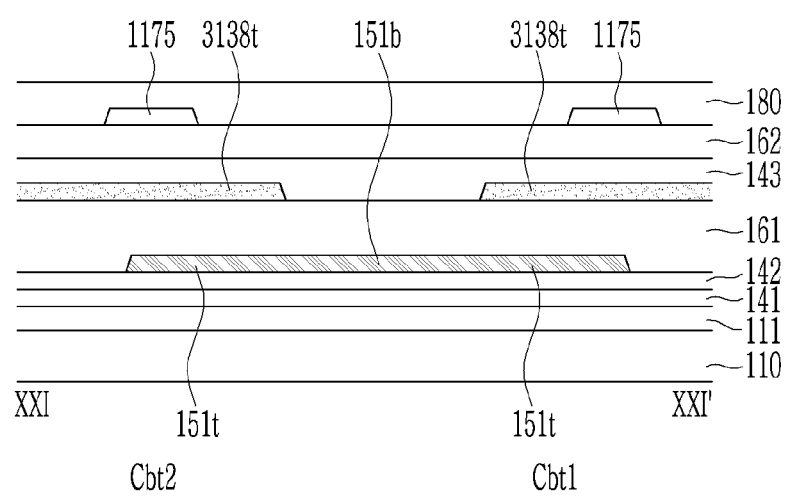
FIG. 21 illustrates a cross-sectional view taken along line XXI-XXI of FIG. 20.

Since many portions of the display device according to the embodiment shown in FIG. 20 and FIG. 21 are the same as those of the display device according to the embodiment shown in FIG. 1 to FIG. 10, a repeated description thereof will be omitted. The present embodiment differs from the previous embodiment in that the lower first scan line does not overlap the boost capacitor, and will be further described below.

FIG. 20 illustrates a top plan view of pixels of a display device according to another embodiment, and FIG. 21 illustrates a cross-sectional view taken along line XXI-XXI of FIG. 20.

As shown in FIG. 20 and FIG. 21, the display device according to the embodiment includes a plurality of transistors T1, T2, T3, T4, T5, T6, and T7, a storage capacitor Cst, a boost capacitor Cbt, and a light emitting diode (not shown), connected to a plurality of wires 127, 128, 151, 152, 153, 154, 155, 171, and 172.

In the previous embodiments, the lower first scan line 151a overlaps the boost capacitor Cbt. However, in the present embodiment, the lower first scan line 151a does not overlap the boost capacitor Cbt in a plan view (See FIG. 20).

In the present embodiment, the lower first scan line 151a disposed at the left pixel and the lower first scan line 151a disposed at the right pixel are separated from each other. In the left pixel, the lower first scan line 151a is disposed only in a left partial region, and in the right pixel, the lower first scan line 151a is disposed only in a right partial region. The lower first scan line 151a does not overlap the lower boost electrode 151t. In addition, the lower first scan line 151a does not overlap the upper boost electrode 3138t. Therefore, the lower first scan line 151a does not overlap the boost capacitor Cbt. In each pixel, the lower first scan line 151a and the upper first scan line 151b are connected by the third connection electrode 2175. Accordingly, the lower first scan line 151a disposed in the left pixel and the lower first scan line 151a disposed in the right pixel may be electrically connected by the upper first scan line 151b.

Hereinafter, pixels of a display device according to an embodiment will be described with reference to FIG. 22 and FIG. 23.

Figure 22:
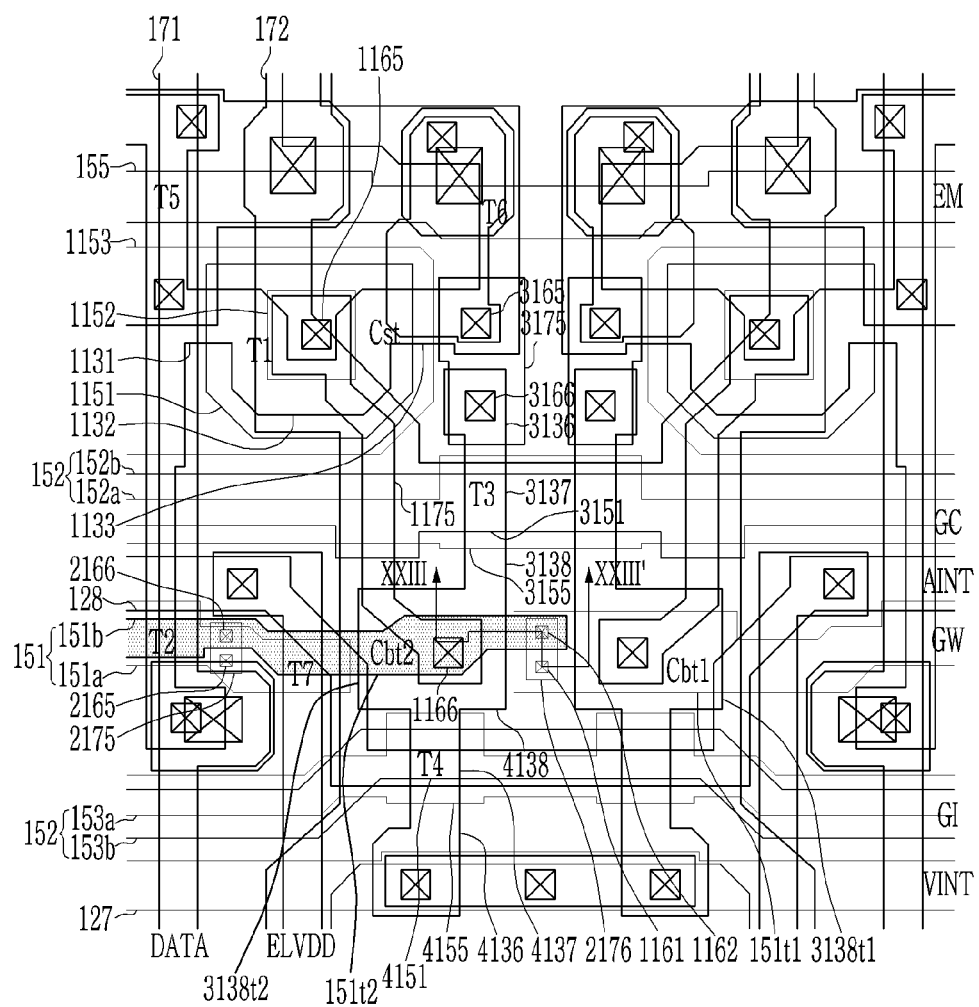
FIG. 22 illustrates a top plan view of pixels of a display device according to still another embodiment.
Figure 23:
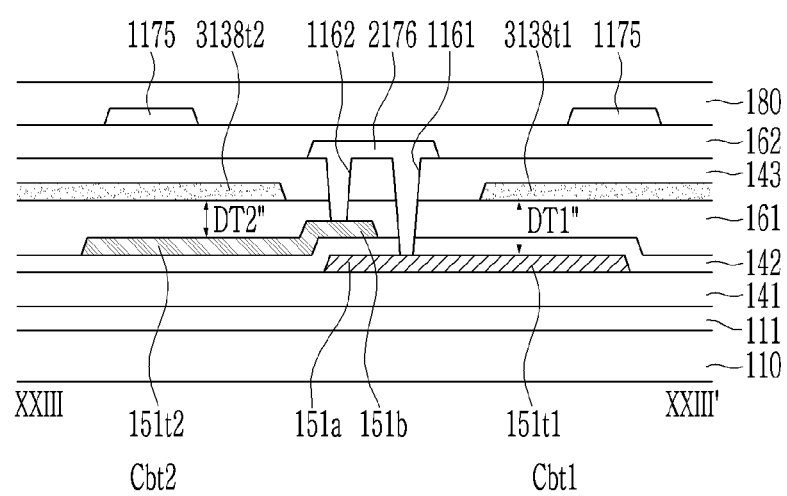
FIG. 23 illustrates a cross-sectional view taken along line XXIII-XXIII of FIG. 22.

Since many portions of the display device according to the embodiment shown in FIG. 22 and FIG. 23 are the same as those of the display device according to the embodiment shown in FIG. 20 and FIG. 21, a repeated description thereof will be omitted. In the present embodiment, features in which lower boost electrodes of some pixels are made of the second gate conductor and lower boost electrodes of some other pixels are made of the first gate conductor are different from the previous embodiment, and will be further described below.

FIG. 22 illustrates a top plan view of pixels of a display device according to still another embodiment, and FIG. 23 illustrates a cross-sectional view taken along line XXIII-XXIII of FIG. 22.

As shown in FIG. 22 and FIG. 23, the display device according to the embodiment includes a plurality of transistors T1, T2, T3, T4, T5, T6, and T7, a storage capacitor Cst, a boost capacitor Cbt, and a light emitting diode (not shown), connected to a plurality of wires 127, 128, 151, 152, 153, 154, 155, 171, and 172.

In the previous embodiment in FIGS. 20 and 21, the upper first scan line 151b extends to pass all pixels, and the lower boost electrode 151t is connected to the upper first scan line 151b in all pixels. However, in the present embodiment, the upper first scan line 151b is disposed only in some pixels, and the second lower boost electrode 151t2 is directly connected to the upper first scan line 151b only in the pixel at which the upper first scan line 151b is disposed. The lower first scan line 151a and the upper first scan line 151b may be connected by the third connection electrode 2175. In addition, the lower first scan line 151a and the upper first scan line 151*b* may be connected by a fourth connection electrode 2176. The second gate insulating layer 142, the first interlayer-insulating layer 161, and the third gate insulating layer 143 may be disposed between the lower first scan line 151*a* and the fourth connection electrode 2176. An opening 1161 may be defined in the second gate insulating layer 142, the first interlayer-insulating layer 161, and the third gate insulating layer 143. The fourth connection electrode 2176 may be connected to the lower first scan line 151*a* through the opening 1161. The first interlayer-insulating layer 161 and the third gate insulating layer 143 may be disposed between the upper first scan line 151*b* and the fourth connection electrode 2176. An opening 1162 may be defined in the first interlayer-insulating layer 161 and the third gate insulating layer 143. The fourth connection electrode 2176 may be connected to the upper first scan line 151*b* through the opening 1162.

In the present embodiment, the left and right pixels are substantially symmetrical except for the followings. The upper first scan line 151*b* is disposed only in the left pixel, and is not disposed in the right pixel. In addition, the lower first scan line 151*a* may be directly connected to the boost capacitor Cbt1 in the right pixel, and may not overlap the boost capacitor Cbt2 in the left pixel in a plan view. In the right pixel, the first lower boost electrode 151*t*1 is connected to the lower first scan line 151*a*, and in the left pixel, the second lower boost electrode 151*t*2 is connected to the upper first scan line 151*b*. In the right pixel, the first lower boost electrode 151*t*1 extends from and is integrated with the lower first scan line 151*a*, and in the left pixel, the second lower boost electrode 151*t*2 extends from and is integrated with the upper first scan line 151*b*. In the right pixel, the first lower boost electrode 151*t*1 may be made of the first gate conductor, and in the left pixel, the second lower boost electrode 151*t*2 may be made of the second gate conductor. In the right pixel, the first interlayer-insulating layer 161 and the second gate insulating layer 142 may be disposed between the first lower boost electrode 151*t*1 and the first upper boost electrode 3138*t*1. In the left pixel, the first interlayer-insulating layer 161 may be disposed between the second lower boost electrode 151*t*2 and the second upper boost electrode 3138*t*2. Accordingly, a distance DT1″ between the first lower boost electrode 151*t*1 and the first upper boost electrode 3138*t*1 in the right pixel may be longer than a distance DT2″ between the second lower boost electrode 151*t*2 and the second upper boost electrode 3138*t*2 in the left pixel. Therefore, the capacitance of the first boost capacitor Cbt1 of the right pixel may be different from that of the second boost capacitor Cbt2 of the left pixel. The capacitance of the first boost capacitor Cbt1 of the right pixel may be smaller than that of the second boost capacitor Cbt2 of the left pixel.

While this disclosure has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

<Description of symbols>

| | |
|---|---|
| 110: substrate | 141: first gate insulating layer |
| 142: second gate insulating layer | 143: third gate insulating layer |
| 151: first scan line | 151a: lower first scan line |
| 151b: upper first scan line | 151t: lower boost electrode |
| 151t1: first lower boost electrode | 161: first interlayer-insulating layer |
| 151t2: second lower boost electrode | 171: data line |
| 152b: upper second scan line | 2176: fourth connection electrode |
| 162: second interlayer-insulating layer | |
| 180: third interlayer-insulating layer | |
| 1131: first electrode of driving transistor | |
| 1132: channel of driving transistor | |
| 1133: second electrode of driving transistor | |
| 1151: gate electrode of driving transistor | |
| 1153: first storage electrode | |
| 1175: first connection electrode | |
| 2175: third connection electrode | |
| 3136: first electrode of third transistor | |
| 3137: channel of third transistor | |
| 3138: second electrode of third transistor | |
| 3138t: upper boost electrode | |
| 3138t1: first upper boost electrode | |
| 3138t2: second upper boost electrode | |
| 3151: gate electrode of third transistor | |
| 3175: second connection electrode | |

What is claimed is:

1. A display device comprising:
a substrate;
a polycrystalline semiconductor layer which includes a first electrode, a channel, and a second electrode of a driving transistor disposed on the substrate;
a first gate insulating layer disposed on the polycrystalline semiconductor layer;
a gate electrode of the driving transistor, which is disposed on the first gate insulating layer and overlaps the channel of the driving transistor in a plan view;
a lower first scan line disposed on the first gate insulating layer;
a second gate insulating layer disposed on the gate electrode of the driving transistor and on the lower first scan line;
a first lower boost electrode disposed on the second gate insulating layer;
a first interlayer-insulating layer disposed on the first lower boost electrode;
an oxide semiconductor layer disposed on the first interlayer-insulating layer and including a first upper boost electrode overlapping the first lower boost electrode in the plan view; and
a first connection electrode connecting the gate electrode of the driving transistor and the first upper boost electrode; wherein the display device includes a plurality of pixels including a first pixel and a second pixel; the first pixel includes the substrate, the first electrode, the channel and the second electrode of the driving transistor, the first gate insulating layer, the gate electrode of the driving transistor, the lower first scan line, the second gate insulating layer, the first lower boost electrode, the first interlayer-insulating layer, and the first upper boost electrode; and the second pixel includes the substrate, a first electrode, a channel, and a second electrode of another driving transistor, the first gate insulating layer, a gate electrode of the another driving transistor, the lower first scan line, the second gate insulating layer, the first interlayer-insulating layer, a second lower boost electrode which is disposed between the first gate insulating layer and the second gate insulating layer and is connected to the lower first scan line, and a second upper boost electrode which is disposed on the first interlayer-insulating layer, overlaps the second lower boost electrode, and includes an oxide semiconductor; wherein the second lower boost electrode extends from and is monolithic with the lower first scan line.

2. The display device of claim 1, further comprising a storage electrode of a storage capacitor disposed on the second gate insulating layer and overlapping the gate electrode of the driving transistor in the plan view, wherein the storage electrode is disposed in a same layer as the first lower boost electrode.

3. The display device of claim 1, further comprising a third gate insulating layer disposed on the oxide semiconductor layer, and
a gate electrode of a third transistor disposed on the third gate insulating layer,
wherein the oxide semiconductor layer further includes a first electrode, a channel, and a second electrode of a third transistor which are disposed on the first interlayer-insulating layer;
the gate electrode of the third transistor overlaps the channel of the third transistor in the plan view;
the first electrode of the third transistor is connected to a second electrode of the driving transistor; and
the second electrode of the third transistor is connected to the first upper boost electrode.

4. The display device of claim 3, further comprising a second connection electrode connecting the first electrode of the third transistor and the second electrode of the driving transistor,
wherein the second electrode of the third transistor is monolithic with the first upper boost electrode.

5. The display device of claim 1, further comprising an upper first scan line disposed on the second gate insulating layer,
wherein the first lower boost electrode extends from and is monolithic with the upper first scan line, and
a first scan signal is commonly applied to the lower first scan line and the upper first scan line.

6. The display device of claim 5, wherein the upper first scan line overlaps the lower first scan line in the plan view, and the upper first scan line is connected to the lower first scan line.

7. The display device of claim 5, further comprising a third connection electrode connecting the upper first scan line and the lower first scan line.

8. The display device of claim 7, further comprising:
a first electrode, a channel, and a second electrode of a third transistor, which are disposed on the first interlayer-insulating layer;
a third gate insulating layer disposed on the first electrode, the channel, and the second electrode of the third transistor; and
a gate electrode of the third transistor which is disposed on the third gate insulating layer and overlaps the channel of the third transistor in the plan view,
wherein the third connection electrode is disposed in a same layer as the gate electrode of the third transistor.

9. The display device of claim 8, wherein
the third gate insulating layer defines a first opening overlapping the lower first scan line and a second opening overlapping the upper first scan line;
the third connection electrode is connected to the lower first scan line through the first opening; and
the third connection electrode is connected to the upper first scan line through the second opening.

10. The display device of claim 8, wherein
the third gate insulating layer defines an opening overlapping the lower first scan line and the upper first scan line;
the third connection electrode is connected to an upper surface of the lower first scan line through the opening; and
the third connection electrode is connected to a lateral surface of the upper first scan line through the opening.

11. The display device of claim 7, further comprising a third gate insulating layer and a second interlayer-insulating layer which are disposed on the first interlayer-insulating layer,
wherein the first connection electrode and the third connection electrode are disposed on the second interlayer-insulating layer.

12. The display device of claim 5, wherein
the upper first scan line is directly connected to the lower first scan line.

13. The display device of claim 5, wherein
the lower first scan line does not overlap the first lower boost electrode and the first upper boost electrode.

14. The display device of claim 1, wherein
the first pixel and the second pixel display different colors.

15. The display device of claim 1, wherein
the first lower boost electrode and the first upper boost electrode form a first boost capacitor,
the second lower boost electrode and the second upper boost electrode form a second boost capacitor, and
a capacitance of the first boost capacitor is different from a capacitance of the second boost capacitor.

16. The display device of claim 15, wherein
the capacitance of the first boost capacitor is larger than the capacitance of the second boost capacitor.

17. The display device of claim 1, further comprising an upper first scan line which is disposed on the second gate insulating layer and is connected to the lower first scan line,
wherein the lower first scan line is disposed in both the first pixel and the second pixel, and
the upper first scan line is disposed in the second pixel and is not disposed in the first pixel.

18. The display device of claim 1, further comprising an upper first scan line which is disposed on the second gate insulating layer and is connected to the lower first scan line,
wherein the upper first scan line does not overlap the second lower boost electrode and the second upper boost electrode in the plan view, and
the lower first scan line does not overlap the first lower boost electrode and the first upper boost electrode in the plan view.

* * * * *